(12) United States Patent
Saito

(10) Patent No.: US 9,153,338 B2
(45) Date of Patent: Oct. 6, 2015

(54) SEMICONDUCTOR MEMORY DEVICE

(71) Applicant: Semiconductor Energy Laboratory Co., Ltd., Atsugi, Kanagawa-ken (JP)

(72) Inventor: Toshihiko Saito, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 237 days.

(21) Appl. No.: 13/871,011

(22) Filed: Apr. 26, 2013

(65) Prior Publication Data
US 2013/0235645 A1   Sep. 12, 2013

Related U.S. Application Data

(63) Continuation of application No. 12/960,117, filed on Dec. 3, 2010, now Pat. No. 8,432,718.

(30) Foreign Application Priority Data

Dec. 4, 2009   (JP) .................................. 2009-276751

(51) Int. Cl.
*G11C 17/00* (2006.01)
*G11C 17/12* (2006.01)
*H01L 27/105* (2006.01)
(Continued)

(52) U.S. Cl.
CPC .............. *G11C 17/12* (2013.01); *H01L 27/105* (2013.01); *H01L 27/1052* (2013.01); *H01L 27/1214* (2013.01); *G11C 17/18* (2013.01)

(58) Field of Classification Search
CPC ................................. G11C 17/12; G11C 17/26
USPC .............................. 365/104, 174, 177, 185.05
See application file for complete search history.

(56) References Cited

U.S. PATENT DOCUMENTS 5,627,779 A * 5/1997 Odake et al. ............. 365/185.01
5,731,856 A   3/1998 Kim et al.
(Continued)

FOREIGN PATENT DOCUMENTS

EP   1719169 A1   11/2006
EP   1 737 044 A1   12/2006
(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
(Continued)

*Primary Examiner* — Son Dinh
(74) *Attorney, Agent, or Firm* — Fish & Richardson P.C.

(57) ABSTRACT

To provide a semiconductor memory device including an oxide semiconductor that can deal with instability of a threshold characteristic, in which writing is possible by a simple method. The semiconductor memory device functions by utilizing a characteristic that a threshold shifts when a thin film transistor including an oxide semiconductor is irradiated with ultraviolet light. Readout can be performed by setting a readout voltage between the threshold before the ultraviolet light irradiation and the threshold after irradiation. The threshold characteristic of an initial characteristic can be controlled by providing a back gate or by using two thin film transistors.

21 Claims, 19 Drawing Sheets

(51) Int. Cl.
  *H01L 27/12* (2006.01)
  *G11C 17/18* (2006.01)

(56) References Cited

U.S. PATENT DOCUMENTS

| | | | |
|---|---|---|---|
| 5,744,864 | A | 4/1998 | Cillessen et al. |
| 5,753,946 | A | 5/1998 | Naiki et al. |
| 6,294,274 | B1 | 9/2001 | Kawazoe et al. |
| 6,458,637 | B1 | 10/2002 | Yamazaki et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,596,749 | B2 | 9/2009 | Motoyama et al. |
| 7,601,984 | B2 | 10/2009 | Sano et al. |
| 7,666,722 | B2 | 2/2010 | Koyama |
| 7,674,650 | B2 | 3/2010 | Akimoto et al. |
| 7,732,819 | B2 | 6/2010 | Akimoto et al. |
| 7,898,020 | B2 * | 3/2011 | Makihara et al. .............. 257/321 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0267141 | A1 | 11/2006 | Saito |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2008/0308796 | A1 | 12/2008 | Akimoto et al. |
| 2008/0308797 | A1 | 12/2008 | Akimoto et al. |
| 2008/0308805 | A1 | 12/2008 | Akimoto et al. |
| 2008/0308806 | A1 | 12/2008 | Akimoto et al. |
| 2009/0008639 | A1 | 1/2009 | Akimoto et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0179199 | A1 | 7/2009 | Sano et al. |
| 2009/0239335 | A1 | 9/2009 | Akimoto et al. |
| 2009/0278122 | A1 | 11/2009 | Hosono et al. |
| 2009/0280600 | A1 | 11/2009 | Hosono et al. |
| 2009/0305461 | A1 | 12/2009 | Akimoto et al. |
| 2010/0065844 | A1 | 3/2010 | Tokunaga |
| 2010/0092800 | A1 | 4/2010 | Itagaki et al. |
| 2010/0097838 | A1 | 4/2010 | Tanaka et al. |
| 2010/0109002 | A1 | 5/2010 | Itagaki et al. |
| 2010/0136743 | A1 | 6/2010 | Akimoto et al. |

FOREIGN PATENT DOCUMENTS

| | | |
|---|---|---|
| EP | 1770788 A2 | 4/2007 |
| EP | 1812969 A2 | 8/2007 |
| EP | 1995787 A2 | 11/2008 |
| EP | 1998374 A2 | 12/2008 |
| EP | 1998375 A2 | 12/2008 |
| EP | 1768311 A3 | 5/2010 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-128399 A | 5/1990 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2000-269505 A | 9/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-268774 A | 9/2005 |
| JP | 2006-165529 A | 6/2006 |
| JP | 2007-013116 A | 1/2007 |
| JP | 2007-096055 A | 4/2007 |
| JP | 2007-123861 A | 5/2007 |
| JP | 2009-146100 A | 7/2009 |

(56) References Cited

FOREIGN PATENT DOCUMENTS

| | | |
|---|---|---|
| JP | 2009-182194 A | 8/2009 |
| WO | 2004/114391 A1 | 12/2004 |
| WO | 2005/081307 A1 | 9/2005 |
| WO | 2006/051993 A2 | 5/2006 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFe2O4, and YB2Fe3O7 Types of Structures for Compounds in the In2O3 and Sc2O3-A2O3-Bo Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IgZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

(56) References Cited

OTHER PUBLICATIONS

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4): a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-in. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GiZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IgZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

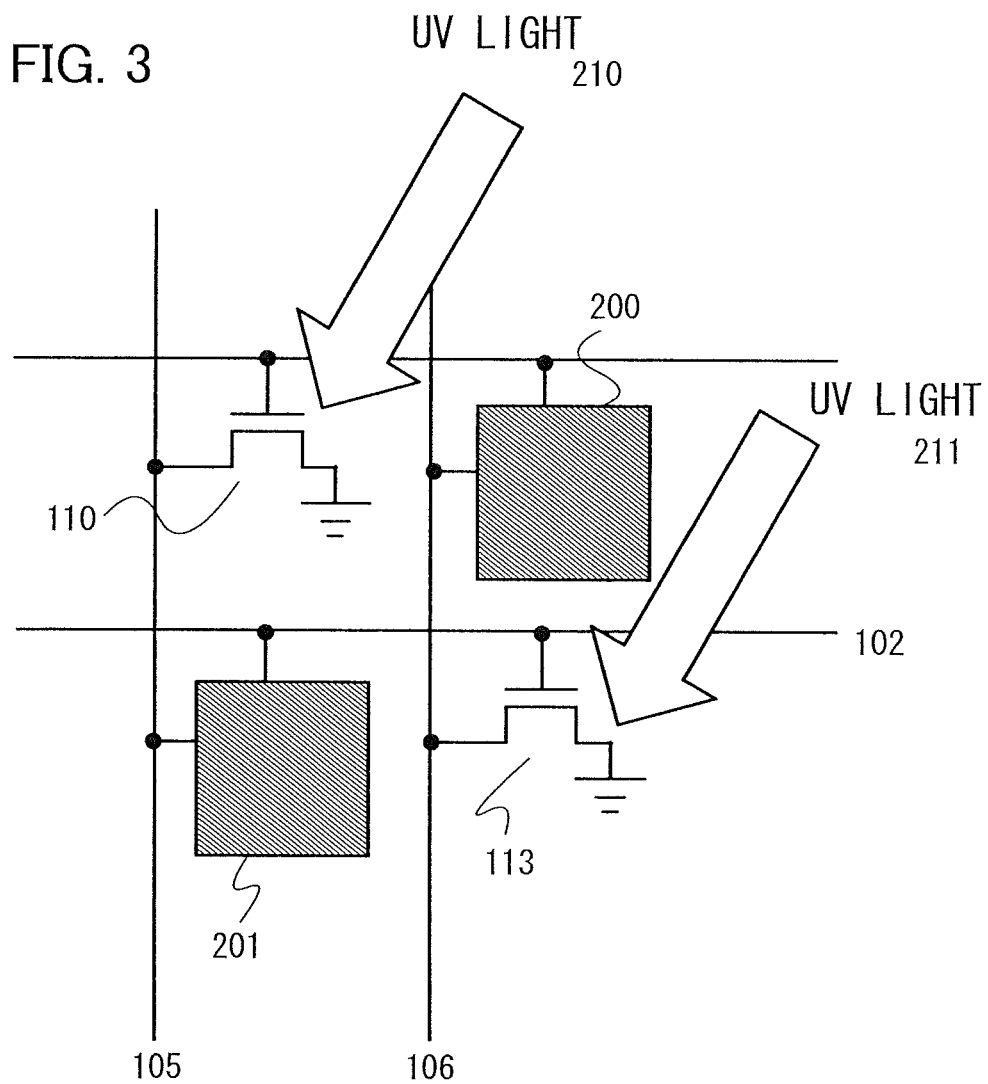

FIG.14

TRUTH TABLE

| WORD LINE | WORD LINE POTENTIAL | WRITING | FIRST THIN FILM TRANSISTOR | SECOND THIN FILM TRANSISTOR | FIRST THIN FILM TRANSISTOR AND SECOND THIN FILM TRANSISTOR | OUTPUT |
|---|---|---|---|---|---|---|
| SELECTED | 0 | YES | ON | ON | ON | HIGH |
| SELECTED | 0 | NO | ON | ON | OFF | LOW |
| NOT SELECTED | VDD | YES | OFF | OFF | OFF | LOW |
| NOT SELECTED | VDD | NO | OFF | ON OR OFF | OFF | LOW |

SEMICONDUCTOR MEMORY DEVICE

CROSS-REFERENCE TO RELATED APPLICATIONS

This application is a continuation of U.S. application Ser. No. 12/960,117, filed Dec. 3, 2010, now allowed, which claims the benefit of a foreign priority application filed in Japan as Serial No. 2009-276751 on Dec. 4, 2009, both of which are incorporated by reference.

BACKGROUND OF THE INVENTION

1. Field of the Invention

The present invention relates to a semiconductor memory circuit.

2. Description of the Related Art

A technique of forming a thin film transistor (TFT) by using a semiconductor thin film formed over a substrate with an insulating surface has attracted attention. Thin film transistors have been used in display devices typified by liquid crystal televisions. Silicon-based semiconductor materials such as amorphous silicon and low temperature crystallized silicon are known as materials for semiconductor thin films that can be applied to thin film transistors, and as another material, an oxide semiconductor has also attracted attention.

As a material for the oxide semiconductor, zinc oxide or a material containing zinc oxide as a component are known. Also, a thin film transistor made of an amorphous oxide (an oxide semiconductor) with an electron carrier concentration of lower than $10^{18}/cm^3$ is disclosed (see Patent Document 1 to Patent Document 3).

Meanwhile, memory devices utilizing thin film transistors have been applied to semiconductor devices with various names such as RFIDs (radio frequency identification), ID tags, IC tags, wireless tags, electronic tags, and wireless chips. Using this semiconductor device, an individual object or product is given an individual identification number (that is, identification: ID), with which the object is identified, cross-checked with history or the like by wireless communication with a wireless readout device in each step or the like, and this identification can be utilized in various fields such as production management, inventory management, and merchandise management. Many of these semiconductor devices each include a circuit using a semiconductor substrate of silicon or the like (referred to as IC (integrated circuit) chip) and an antenna, and the IC chip includes a memory device, a wireless circuit, a control circuit, and the like. Regarding the memory device, the identification number needs to be written in every IC that is to be produced only once during manufacturing, and after that, there is a method of holding information of every step that corresponds to the identification number on a management system side, and a method of writing or rewriting information of every step on an IC chip side, in addition to during manufacturing of the IC chip. For the method of writing only once, there is an example of using an organic memory and an example of using a mask ROM (Read Only Memory) during an exposure step during a semiconductor process. Also, there is an example of utilizing a memory element that utilizes a characteristic that is obtained when a thin film transistor including an oxide semiconductor is irradiated with ultraviolet light.

REFERENCES

Patent Documents

[Patent document 1] Japanese Published Patent Application No. 2007-123861

[Patent document 2] Japanese Published Patent Application No. 2007-96055

[Patent document 3] Japanese Published Patent Application No. 2006-165529

[Patent document 4] Japanese Published Patent Application No. 2005-268774

[Patent document 5] Japanese Published Patent Application No. 2007-13116

[Patent document 6] Japanese Published Patent Application No. 2009-182194

SUMMARY OF THE INVENTION

However, even when the mask ROM method is used to form a memory device, manufacturing steps are relatively complex, and in many cases, the cost is high. In the case of mask ROM, a connecting portion and a cutting portion are formed in a circuit pattern connected to a transistor and a capacitor used for a memory device according to an identification number. For this, a special photomask or an exposure apparatus has to be used during a manufacturing step of an IC chip. For example, to print a different identification number for each IC chip circuit formed over a substrate, an electron beam exposure apparatus is used and data of each chip has to be sent from a host computer, and based on this, a scan pattern of the electron beam has to be changed. That is, it is necessary to perform a step for manufacturing a photomask, which is a step that requires an expensive apparatus and a step with poor throughput that requires extremely long processing time. Other than this, as a method that does not use an electron beam exposure apparatus, there is a method of forming a pattern for every identification number over a photomask in advance. The substrate is exposed to light through a slit formed in only a portion of a desired identification number on the photomask. The IC chip pattern is formed over the substrate. In the next IC chip pattern, a mask is moved to a photomask portion of the next identification number corresponding to the next IC chip pattern, and light exposure is performed. In other words, the mask has to be moved and light exposure has to be repeated as many times as the number of IC chip patterns. There is also a method using a laser, but this also required complex steps and an expensive apparatus.

On the other hand, an organic memory is formed by interposing an organic thin film between an upper electrode and a lower electrode. After a manufacturing process of an IC chip, an electrical field is applied to a circuit pattern of the organic memory to cause an electrical short-circuit in the organic thin film, so as to form a connection between the electrodes. An identification number is formed from a pattern of an insulating portion and a conductive portion. A special probe in contact with the electrode is necessary to form the identification number.

Also, in both methods of the mask ROM method and the organic memory, not only is there a problem during manufacturing of the identification number for every IC chip, after it is used as a product for production management, inventory management, merchandise management, and the like, it is difficult to erase information left on the IC chips. When formed as a mask ROM, information is formed already as a circuit pattern in a photolithography step, and there is no way of erasing the information. With organic memory also, an apparatus such as a special probe or the like is necessary for writing information, and a user cannot easily erase the information.

On the other hand, in the case of using a thin film transistor including an oxide semiconductor, a fact that a characteristic of the thin film transistor easily moving to a negative side by irradiation with ultraviolet light is utilized in a memory device. However, an electrical characteristic of the thin film transistor before irradiation easily becomes a so-called normally-on characteristic, where a current easily occurs between a source and a drain with a gate voltage of 0 volts. With such a characteristic, even if a further negative shift of a threshold occurs with ultraviolet light irradiation, it is difficult to be used as a memory device.

In view of such problems, in one embodiment of the present invention, a semiconductor memory device can be manufactured inexpensively with a shorter process. An object is to provide a thin film transistor with which memory that is left in a semiconductor memory device can be easily erased after use.

One aspect of the invention is a semiconductor memory device comprising:
 a thin film transistor;
 a word line extending in a first direction; and
 a bit line extending in a second direction,
 wherein the thin film transistor includes a first gate electrode layer, a first insulating layer, a channel layer, a source electrode layer, and a drain electrode layer, wherein the channel layer is made of an oxide semiconductor;
 a second insulating layer is provided to be in contact with the channel layer;
 a second gate electrode layer is provided to be in contact with the second insulating layer;
 the word line is connected to the first gate electrode layer;
 the bit line is connected to the source electrode layer;
 the thin film transistor has a first resistance value between the source electrode layer and the drain electrode layer when a readout voltage is applied to the word line;
 the thin film transistor in which writing is performed with ultraviolet light has a second resistance value between the source electrode layer and the drain electrode layer; and
 the first resistance value is larger than the second resistance value.

In the semiconductor memory device according to the above invention, the word line is connected to a row decoder, and the bit line is connected to a column decoder and a readout circuit.

In the semiconductor memory device according to the above invention, the readout circuit comprises a power source and a second thin film transistor, wherein:
 a first source electrode layer of the second thin film transistor is connected to the power source;
 a second drain electrode layer of the second thin film transistor is connected to the source electrode layer; and
 the readout circuit has a method for measuring electrical potential between the second drain electrode layer and the source electrode layer.

The semiconductor memory device according to the above invention comprises:
 a first threshold of an Id-Vg characteristic of the thin film transistor; and
 a second threshold of an Id-Vg characteristic of the thin film transistor that is subjected to ultraviolet light writing,
 wherein the readout voltage is higher than the second threshold, and lower than the first threshold.

Another aspect of the invention is a semiconductor memory device comprising:
 a first thin film transistor;
 a second thin film transistor;
 a bit line extending in a first direction; and
 a word line extending in a second direction,
 wherein the second thin film transistor includes a second channel layer made of an oxide semiconductor layer, a second gate electrode layer, a second source electrode layer, and a second drain electrode layer;
 the first thin film transistor includes a first channel layer, a first insulating layer, a first gate electrode layer, a first source electrode layer, and a first drain electrode layer;
 the first gate electrode layer and the second gate electrode layer are connected to the word line;
 the first source electrode layer is connected to the bit line and the first drain electrode layer is connected to the second source electrode layer;
 the second thin film transistor has a first resistance value between the second source electrode layer and the second drain electrode layer when a readout voltage is applied to the word line;
 the second thin film transistor that is subjected to ultraviolet light writing has a second resistance value between the second source electrode layer and the second drain electrode layer; and
 the first resistance value is larger than the second resistance value current In the semiconductor memory device according to the above invention, the word line is connected to a row decoder, and the bit line is connected to a column decoder and a readout circuit.

In the semiconductor memory device according to the above invention, the readout circuit comprises a power source and a third thin film transistor, wherein:
 a third source electrode layer of the third thin film transistor is connected to the power source;
 a third drain electrode layer is connected to the first source electrode layer; and
 the readout circuit has a method for measuring electrical potential between the third drain electrode layer and the first source electrode layer.

The semiconductor memory device according to the above invention comprises:
 a first threshold of an Id-Vg characteristic of the second thin film transistor;
 a second threshold of an Id-Vg characteristic of the second thin film transistor that is subjected to ultraviolet light writing; and
 a third threshold according to an Id-Vg characteristic of the first thin film transistor,
 wherein the readout voltage is higher than the third threshold and the second threshold, and lower than the first threshold.

By the present invention, effects such as the following can be expected. Firstly, writing can be done faster than MROM in which a contact is formed by a photolithography step, and area reduction can be expected. Writing is possible in a simple step, because data can be written by irradiating with ultraviolet light a desired portion of a substrate including an oxide semiconductor in an active layer, using simple equipment. Secondly, although a photoresist step utilizing a photomask is performed for writing when manufacturing MROM, manufacturing according to the present invention utilizing ultraviolet light is inexpensive. Thirdly, additional data wiring is possible during use. Fourthly, because one-time erasure of data is ultimately possible, when an IC chip using the present invention is destroyed, there is no case of it being disposed of while written data is still held therein. Therefore, it is more secure compared to MROM. Fifthly, since a writing circuit is not necessary, it is possible to manufacture a product with a small area.

In the present invention, by also providing an electrode to be in contact with an active layer in a thin film transistor including an oxide semiconductor in the active layer, a characteristic of a stable threshold has become obtainable. Furthermore, by connecting a source portion of the thin film transistor with an oxide semiconductor layer and a drain portion of the thin film transistor which has the opposite polarity, a device can be made that can sufficiently compensate for a weakness that the threshold of the thin film transistor with an oxide semiconductor layer is unstable, and a semiconductor memory device that requires security in reliability is obtained.

BRIEF DESCRIPTION OF THE DRAWINGS

In the accompanying drawings:

FIG. 3 illustrates a method of writing data into a memory cell array which is one embodiment of the present invention;

FIG. 14 shows operation of a memory cell array which is one embodiment of the present invention;

DETAILED DESCRIPTION OF THE INVENTION

Figure 1A:
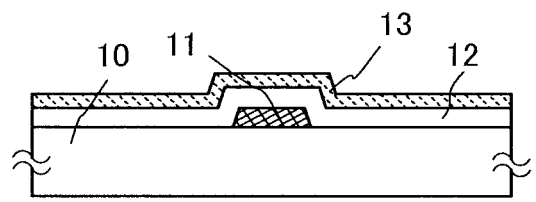
FIGS. 1A to 1E illustrate a thin film transistor which is one embodiment of the present invention and a manufacturing method thereof.
Figure 1B:
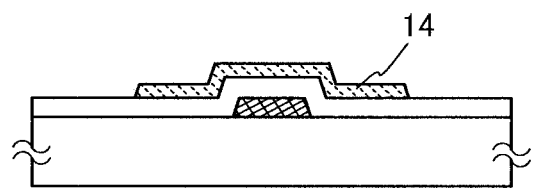

Hereinafter, embodiments of the present invention are described with reference to the drawings. However, the present invention is not limited to the following description. The present invention can be implemented in various different ways and it will be readily appreciated by those skilled in the art that various changes and modifications are possible without departing from the spirit and the scope of the present invention. Therefore, unless such changes and modifications depart from the scope of the invention, they should be construed as being included therein. Note that reference numerals denoting the same portions are commonly used in different drawings.

Note that the size, the thickness of a layer, and a region of each structure illustrated in the drawings and the like in the embodiments are exaggerated for simplicity in some cases. Therefore, embodiments of the present invention are not limited to such scales.

Note that terms with ordinal numbers such as "first", "second", and "third" in this specification are used in order to identify components, and the terms do not limit the components numerically.

(Embodiment 1)

In this embodiment, a semiconductor memory device which is an embodiment of the present invention is described.

To describe using a thin film transistor is FIGS. 1A to 1E, a gate electrode layer 11 is formed over a substrate with an insulating surface, and then a gate insulating layer 12 is formed thereover. Then, an oxide semiconductor layer 14 is formed thereover, and a source electrode layer 15a and a drain electrode layer 15b are formed over a source portion and a drain portion of the oxide semiconductor layer, respectively. Next, after forming an oxide insulating layer 16, a back gate electrode layer 19 is formed. That is, over a surface of the semiconductor layer that is opposite the side on which the gate insulating layer and the gate electrode layer are formed, an oxide insulating layer and a back gate electrode layer are formed. As opposed to the gate electrode layer applying an electrical field to the semiconductor layer and controlling switching of the semiconductor layer, the back gate electrode layer is utilized for protecting a rear surface thereof along with controlling unstable threshold. In a thin film transistor in which an oxide semiconductor is used in an active layer, moisture, a hydroxyl group, hydrogen, or the like works as an impurity and this leads to shifting of the threshold. The back gate electrode layer is provided to prevent the threshold from shifting.

Here, the source electrode layer and the drain electrode layer in the thin film transistor are both connected to the semiconductor layer, and when voltage is applied to the gate electrode layer, a current flows depending on a difference in potential between the source electrode layer and the drain electrode layer. Here, in the case of describing a structure of the thin film transistor, names "source electrode layer" and "drain electrode layer" are used. Within a context of driving the thin film transistor, naming of the source electrode layer and the drain electrode layer only expresses connection relationships with others, and does not specify direction of a current. Although there are ways of using one or both names of the source electrode layer and the drain electrode layer, such ways of naming does not produce particular differences in meaning.

Accordingly, regarding the thin film transistor provided with the back gate electrode layer, although a diagram in the case of a bottom-gate thin film transistor is shown in FIGS. 1A to 1E, the same technique can be applied to a top-gate thin film transistor without being limited thereto. In that case, the back gate electrode layer, the oxide insulating layer, a channel layer, the gate insulating layer, the gate electrode layer, the source electrode layer and the drain electrode layer are formed in this order from a substrate side. Here, the gate electrode layer 11 may have a function of the back gate and the back gate electrode layer 19 may apply an electrical field to the oxide semiconductor layer 14 and control switching of the semiconductor layer. Both the gate electrode layer 11 and the back gate electrode layer 19 may apply an electrical field to the oxide semiconductor layer 14 and control switching of the semiconductor layer.

The thin film transistor with an oxide semiconductor provided with a back gate electrode layer will be described using FIGS. 1A to 1E following process steps. Although there is no significant restriction on a substrate that can be used as a substrate 10 with an insulating surface, it is necessary that the substrate at least has heat resistance that can resist a heating treatment that is performed later. A glass substrate of barium borosilicate glass, aluminoborosilicate glass, or the like can be used.

Also, in the case that a temperature of the heating treatment performed later is high, it is preferable to use a glass substrate that has a strain point at 630° C. or higher. Also, for the glass substrate, a glass material such as aluminosilicate glass, aluminoborosilicate glass, or barium borosilicate glass is used, for example. Note that, a more practical heat-resistant glass can be obtained when a larger amount of barium oxide (BaO) is contained compared to diboron trioxide ($B_2O_3$). Therefore, it is preferable to use a glass substrate that contains more BaO than $B_2O_3$.

Note that, instead of the above glass substrate, a substrate made of an insulator such as a ceramic substrate, a quartz substrate, or a sapphire substrate may be used. Alternatively, crystallized glass or the like can be used.

Although not shown in FIG. 1A, an insulating layer that is a base layer may be provided between the substrate 10 and the gate electrode layer 11. The base layer has a function of preventing diffusion of an impurity element from the substrate 10, and can be formed with a single-layer structure or a laminated structure using any of a silicon nitride layer, a silicon oxide, layer, a silicon nitride oxide layer, and a silicon oxynitride layer.

Also, the gate electrode layer 11 can be formed as a single layer or a laminated layer, using a metal material such as molybdenum, titanium, chromium, tantalum, tungsten, aluminum, copper, neodymium, or scandium, or an alloy material containing any of these materials as a main component. As a two-layer laminated structure, the following is preferable, for example: a two-layer laminated structure in which a molybdenum layer is laminated over an aluminum layer; a two-layer laminated structure in which a molybdenum layer is laminated over a copper layer; a two-layer laminated structure in which a titanium nitride layer or a tantalum nitride layer is laminated over a copper layer; a two-layer laminated structure in which a molybdenum layer is laminated over a titanium nitride layer; or a two-layer laminated structure in which a tungsten layer is laminated over a tungsten nitride layer. As a three-layer laminated structure, a laminated layer of the following is preferable: a tungsten layer or a tungsten nitride layer; an alloy layer of aluminum and nitride or an alloy layer of aluminum and titanium; and a titanium nitride layer or a titanium layer.

Next, the gate insulating layer 12 is formed over the gate electrode layer 11.

The gate insulating layer 12 can be formed by a plasma CVD method, a sputtering method, or the like, as a single layer selected from the following layers or a laminated layer of one or more types of the following layers: a silicon oxide layer, a silicon nitride layer, a silicon oxynitride layer, a silicon nitride oxide layer, and an aluminum oxide layer. For example, a silicon oxynitride layer may be formed by a plasma CVD method using $SiH_4$, oxygen, nitrogen, or an oxide of nitrogen as a deposition gas. A thickness of the gate insulating layer 12 is 10 nm or more and 300 nm or less, and in the case of a laminated layer, the laminated layer includes a first gate insulating layer with a thickness of 5 nm or more and 150 nm or less and a second gate insulating layer with a thickness of 5 nm or more and 150 nm or less over the first gate insulating layer, for example.

In this embodiment, a silicon oxynitride layer with a thickness of 100 nm or less is formed as the gate insulating layer 12 by a plasma CVD method.

Next, over the gate insulating layer 12, an oxide semiconductor layer 13 with a thickness of 2 nm or more and 200 nm or less is formed.

Note that, before forming the oxide semiconductor layer 13 by a sputtering method, dust on a surface of the gate insulating layer 12 is preferably removed by reverse sputtering in which plasma is generated by introducing argon gas. Note that instead of an argon atmosphere, a nitrogen atmosphere, a helium atmosphere, an oxygen atmosphere, or the like may be used.

As the oxide semiconductor layer 13, the following may be used: an In—Ga—Zn—O-based oxide semiconductor layer; an In—Sn—O-based oxide semiconductor layer; an In—Sn—Zn—O-based oxide semiconductor layer; an In—Al—Zn—O-based oxide semiconductor layer; a Sn—Ga—Zn—O-based oxide semiconductor layer; an Al—Ga—Zn—O-based oxide semiconductor layer; a Sn—Al—Zn—O-based oxide semiconductor layer; an In—Zn—O-based oxide semiconductor layer; a Sn—Zn—O-based oxide semiconductor layer; an Al—Zn—O-based oxide semiconductor layer; an In—O-based oxide semiconductor layer; a Sn—O-based oxide semiconductor layer; or a Zn—O-based oxide semiconductor layer. In this embodiment, the oxide semiconductor layer 13 is formed by a sputtering method using an In—Ga—Zn—O-based oxide semiconductor target. Alternatively, the oxide semiconductor layer 13 can be formed by a sputtering method in a rare gas (typically argon) atmosphere, an oxygen atmosphere, or an atmosphere including a rare gas (typically argon) and oxygen. In the case of using a sputtering method, a target containing $SiO_2$ at 2 wt % or more and 10 wt % or less may be used for film formation.

As a target for manufacturing the oxide semiconductor layer 13 by a sputtering method, a metal oxide target containing zinc oxide as a main component can be used. Also, as another example of a metal oxide target, an oxide semiconductor target containing In, Ga, and Zn (composition ratio of $In_2O_3:Ga_2O_3:ZnO=1:1:1$[mol], In:Ga:Zn=1:1:0.5[atom]) can be used. Alternatively, as the oxide semiconductor target containing In, Ga, and Zn, a target with a composition ratio of In:Ga:Zn=1:1:1[atom] or In:Ga:Zn=1:1:2[atom] can be used. A filling rate of the oxide semiconductor target is 90% or more and 100% or less, and preferably 95% or more and 99.9% or less. By using an oxide semiconductor target with a high filling rate, a dense film is formed as the oxide semiconductor layer.

As a sputtering gas that is used when forming the oxide semiconductor layer 13, it is preferable to use a high-purity gas from which an impurity such as hydrogen, water, a hydroxyl group, or a hydride is removed to a concentration expressed by a level of about ppm or ppb.

The substrate is held in a treatment chamber kept under reduced pressure, and a substrate temperature is set at 100° C. or higher and 600° C. or lower, preferably 200° C. or higher and 400° C. or lower. By heating the substrate during film formation, an impurity concentration in the oxide semiconductor layer that is formed can be reduced. Also, damage by sputtering can be reduced. Then, a sputtering gas from which hydrogen and moisture are removed is introduced while remaining moisture in the treatment chamber is removed, and the oxide semiconductor layer is formed over the substrate with a metal oxide as the target. To remove the remaining moisture from the treatment chamber, a sorption vacuum pump is preferably used. For example, a cryopump, an ion pump, or a titanium sublimation pump is preferably used. Also, as an evacuation method, a turbo molecular pump using liquid nitrogen, liquid hydrogen, or the like to which a cold trap is added may be used. In the film formation chamber evacuated using the cryopump, a hydrogen atom, a compound containing a hydrogen atom such as water ($H_2O$) (more preferably, also a compound containing a carbon atom) and the like are evacuated, and a concentration of an impurity contained in the oxide semiconductor layer formed in the film formation chamber can be reduced.

As one example of film formation conditions, the following conditions are applied: distance of 100 mm between the substrate and the target; pressure of 0.6 Pa; direct-current (DC) power source of 0.5 kW; and an oxygen atmosphere (proportion of oxygen flow rate is 100%). Note that it is preferable to use a pulsed direct-current (DC) power source because a powder substance (also called particle or dust) generated during film formation can be reduced and thickness distribution can be uniform. The thickness of the oxide semiconductor layer is preferably 5 nm or more and 30 nm or less. Note that, appropriate thickness differs depending on an oxide semiconductor material that is used, and the thickness may be appropriately determined depending on the material.

Next, the oxide semiconductor layer 13 is processed into an island-shaped oxide semiconductor layer by a second photolithography step. A resist mask for forming the island-shaped oxide semiconductor layer may be formed by an inkjet method. By forming the resist mask by an inkjet method, manufacturing cost can be reduced since a photomask is not used.

Next, the oxide semiconductor layer is subjected to a first heating treatment. By this first heating treatment, the oxide semiconductor layer can be dehydrated or dehydrogenated. A temperature of the first heating treatment is 400° C. or higher and 750° C. or lower, preferably 400° C. or higher and less than a strain point of the substrate. Here, the substrate is introduced into an electric furnace which is one type of heating treatment apparatuses, and the oxide semiconductor layer is subjected to a heating treatment for one hour at 450° C. in a nitrogen atmosphere; after that, the oxide semiconductor layer 14 is obtained by preventing reentry of water or hydrogen in the oxide semiconductor layer without exposure to air.

Note that, the heating treatment apparatus is not limited to an electric furnace, and an apparatus may be provided which heats an object to be processed using heat conduction or heat radiation from a heating element such as a resistance heating element. For example, an RTA (Rapid Thermal Anneal) apparatus such as a GRTA (Gas Rapid Thermal Anneal) apparatus or a LRTA (Lamp Rapid Thermal Anneal) apparatus can be used. The LRTA apparatus is an apparatus that heats an object to be processed with radiation of light emitted from a lamp such as a halogen lamp, a metal halide lamp, a xenon arc lamp, a carbon arc lamp, a high-pressure sodium lamp, or a high-pressure mercury lamp The GRTA apparatus is an apparatus that performed a heating treatment using a high-temperature gas. As the gas, an inert gas that does not react with the object to be processed due to the heating treatment, such as nitrogen or a rare gas such as argon, is used.

For example, GRTA may be performed as the first heating treatment, by which the substrate is moved into an inert gas heated to a high temperature of 650° C. to 700° C., heated for several minutes, and then moved out of the inert gas heated to the high temperature. With GRTA, a high-temperature heating treatment is possible in a short amount of time.

Note that, in the first heating treatment, it is preferable that water, hydrogen, or the like is not contained in an atmosphere of nitrogen or a rare gas such as helium, neon, or argon. Also, it is preferable that purity of nitrogen or the rare gas such as helium, neon, or argon that is introduced into the heating treatment apparatus is 6N (99.9999%) or higher, and preferably 7N (99.99999%) or higher (that is, impurity concentration is 1 ppm or lower, preferably 0.1 ppm or lower).

Also, depending on the condition of the first heating treatment or the material of the oxide semiconductor layer, the oxide semiconductor layer may crystallize and become a microcrystalline layer or a polycrystalline layer. For example, the oxide semiconductor layer may crystallize and become microcrystalline with a degree of crystallization of 90% or higher or 80% or higher. Further, depending on the condition of the first heating treatment or the material of the oxide semiconductor layer, the oxide semiconductor layer may become amorphous, which contains no crystalline component. Furthermore, the oxide semiconductor layer may become an oxide semiconductor layer in which a microcrystalline portion (grain diameter of 1 nm or larger and 20 nm or smaller (typically 2 nm or larger and 4 nm or smaller)) is mixed in an amorphous oxide semiconductor.

Also, the first heating treatment of the oxide semiconductor layer can be performed on the oxide semiconductor layer 13 before processing it into the island-shaped oxide semiconductor layer. In that case, the substrate is taken out of the heating apparatus after the first heating treatment, and a photolithography step is performed.

The heating treatment which has an effect of dehydration or dehydrogenation on the oxide semiconductor layer may be performed after forming the oxide semiconductor layer, after laminating a source electrode and a drain electrode over the oxide semiconductor layer, or after a protective insulating layer is formed over the source electrode and the drain electrode.

Also, in the case of forming a contact hole in the gate insulating layer 12, a step thereof may be performed before or after performing a dehydration or dehydrogenation treatment on the oxide semiconductor layer 13.

Note that, etching of the oxide semiconductor layer here is not limited to wet etching, and dry etching may also be used.

Etching conditions (such as etchant, etching time, and temperature) are appropriately adjusted depending on the material so that the material can be etched into a desired shape.

Next, a conductive layer is formed over the gate insulating layer 12 and the oxide semiconductor layer 13. The conductive layer may be formed by a sputtering method or a vacuum evaporation method. As a material of the conductive film, an element selected from Al, Cr, Cu, Ta, Ti, Mo, and W; an alloy containing any of the above-mentioned elements as a component; an alloy layer in which any of the above-mentioned elements are combined; or the like can be given. The conductive layer may contain one or a plurality of materials selected from manganese, magnesium, zirconium, beryllium, and yttrium. Furthermore, the conductive layer may have a single-layer structure or a laminated structure with two or more layers. For example, a single layer structure of an aluminum film containing silicon; a two-layer structure in which a titanium layer is laminated over an aluminum layer; a three-layer structure in which a Ti layer, an aluminum layer, and a Ti layer are laminated in this order; and the like can be given. Alternatively, a layer, an alloy layer, or a nitride layer in which Al is combined with one or a plurality of elements selected from the following may be used: titanium (Ti), tantalum (Ta), tungsten (W), molybdenum (Mo), chromium (Cr), neodymium (Nd), and scandium (Sc).

In the case that a heating treatment is performed after forming the conductive layer, it is preferable that the conductive layer is given heat resistance that is enough to withstand this heating treatment.

In a third photolithography step, a resist mask is formed over the conductive layer, etching is performed selectively to form a source electrode layer 15a and a drain electrode layer 15b, and then the resist mask is removed.

For light exposure during formation of the resist mask in the third photolithography step, ultraviolet light, KrF laser beam, or ArF laser beam is used. A channel length L of a thin film transistor to be formed later is determined by a distance between a lower end portion of the source electrode layer and a lower end portion of the drain electrode layer that are adjacent to each other over the oxide semiconductor layer 14. Note that, in the case of performing light exposure when channel length L is less than 25 nm, light exposure during formation of the resist mask in the third photolithography step is performed using extreme ultraviolet light with an extremely short wavelength of several nanometers to several tens of nanometers is used. Light exposure with extreme ultraviolet light leads to high resolution and large depth of focus. Accordingly, the channel length L of the thin film transistor to be formed later can be set to 10 nm or more and 1000 nm or less, thereby increasing operation speed of a circuit and an OFF-current value is extremely small. With this, reduction in power consumption can be achieved.

Note that, materials and etching conditions are appropriately adjusted so that the oxide semiconductor layer 14 is not removed when the conductive layer is etched.

In this embodiment, a Ti layer is used as the conductive layer, an In—Ga—Zn—O-based oxide semiconductor is used for the oxide semiconductor layer 14, and an ammonia hydrogen peroxide solution (a mixed solution of ammonia, water, and a hydrogen peroxide solution) is used as the etchant.

Note that, in the third photolithography step, only a portion of the oxide semiconductor layer 14 is etched, and an oxide semiconductor layer with a groove portion (a depressed portion) is formed in some cases. Also, a resist mask for forming the source electrode layer 15a and the drain electrode layer 15b may be formed by an inkjet method. By foaming the resist mask by an inkjet method, manufacturing cost can be reduced since a photomask is not used.

Furthermore, an oxide conductive layer may be formed between the source and drain electrode layers and the oxide semiconductor layer. The oxide conductive layer and the metal layer for forming the source electrode layer and the drain electrode layer can be formed successively. The oxide conductive layer can function as a source region and a drain region.

By providing the oxide conductive layer as the source region and the drain region between the oxide semiconductor layer and the source and drain electrode layers, reduction in resistance in the source region and the drain region can be achieved and the transistor can operate at high speed.

Also, to reduce the number of photomasks used in the photolithography steps and to reduce the number of steps, an etching step may be performed using a resist mask that is formed using a multi-tome mask which is a light-exposure mask through which light is transmitted to have a plurality of intensities. A resist mask formed by using a multi-tone mask has a plurality of thicknesses, and a form thereof can be further changed by etching; therefore, the resist mask can be used in a plurality of etching steps for processing into different patterns. Accordingly, with one multi-tone mask, a resist mask that corresponds to at least two different types of patterns can be formed. Thus, the number of light-exposure masks can be reduced as well as corresponding photolithography steps, and simplification of the steps is possible.

Next, a plasma treatment is performed using a gas such as $N_2O$, $N_2$, or Ar. By this plasma treatment, adsorbed water and the like attached to an exposed surface of the oxide semiconductor layer are removed. The plasma treatment may be performed using a mixed gas of oxygen and argon.

After performing the plasma treatment, the oxide insulating layer 16 which is a protective insulating layer and is in contact with a portion of the oxide semiconductor layer is formed without coming into contact with air.

The oxide insulating layer 16 may be formed to have a thickness of 1 nm or more, by appropriately using a method that does not allow an impurity such as water or hydrogen to be mixed into the oxide insulating layer 16, such as a sputtering method. If hydrogen is contained in the oxide insulating layer 16, the hydrogen enters the oxide semiconductor layer or the hydrogen extracts oxygen from the oxide semiconductor layer, thereby causing resistance reduction of a portion (back channel) of the oxide semiconductor layer that is in contact with the oxide insulating layer 16 (is turned into an n-channel type), and there is concern that a parasitic channel is formed. Therefore, it is important that hydrogen is not used in the film formation method so that the oxide insulating layer 16 is formed to be a film that contains as little hydrogen as possible.

In this embodiment, a silicon oxide layer with a thickness of 200 nm is formed as the oxide insulating layer 16 by a sputtering method. The substrate temperature during film formation may be set at room temperature or higher and 300° C. or lower, and in this embodiment, it is set as 100° C. The silicon oxide layer can be foamed by a sputtering method in a rare gas (typically argon) atmosphere, an oxygen atmosphere, or an atmosphere of a rare gas (typically argon) and oxygen. Also, as a target, a silicon oxide target or a silicon target can be used. For example, using a silicon target, silicon oxide can be formed by a sputtering method in an atmosphere of oxygen and nitrogen. The oxide insulating layer 16 that is formed in contact with the oxide semiconductor layer with reduced resistance is formed using an inorganic insulating layer that does not contain an impurity such as moisture, hydrogen ions, or Off, and blocks such an impurity from entering from outside. Typically, a silicon oxide layer, a silicon oxynitride layer, an aluminum oxide layer, an aluminum oxynitride layer, or the like is used.

In this case, it is preferable to form the oxide insulating layer 16 while removing remaining moisture from the treatment chamber. This is to prevent the oxide semiconductor layer 13 and the oxide insulating layer 16 from containing hydrogen, a hydroxyl group, or moisture.

To remove the remaining moisture from the treatment chamber, an entrapment vacuum pump is preferably used. For example, a cryopump, an ion pump, or a titanium sublimation pump is preferably used. Also, as an evacuation method, a turbo pump to which a cold trap is added may be used. In the film formation chamber evacuated using a cryopump, a hydrogen atom, a compound containing a hydrogen atom such as water ($H_2O$) and the like are evacuated, and a concentration of an impurity contained in the oxide insulating layer 16 formed in the film formation chamber can be reduced.

As a sputtering gas that is used when forming the oxide insulating layer 16, it is preferable to use a high-purity gas from which an impurity such as hydrogen, water, a hydroxyl group, or a hydride is removed to a concentration expressed by a level of about ppm or ppb.

Next, a second heating treatment (preferably at 200° C. or higher and 400° C. or lower, for example, 250° C. or higher and 350° C. or lower) is performed in an inert gas atmosphere, or an oxygen gas atmosphere. For example, the second heating treatment is performed for one hour at 250° in a nitrogen atmosphere. When the second heating treatment is performed, heat is applied while a portion (channel formation region) of the oxide semiconductor layer is in contact with the oxide insulating layer 16.

Through the above steps, the heating treatment for dehydration or dehydrogenation is performed on the oxide semiconductor layer after film formation to reduce resistance, and then a portion of the oxide semiconductor layer selectively made to be in an oxygen-excess state. As a result, a channel formation region 17 which overlaps with the gate electrode layer 11 becomes i-type, and a high-resistance source region 18a which overlaps with the source electrode layer 15a and a high-resistance drain region 18b which overlaps with the drain electrode layer 15b are formed in a self-aligning manner. Through the above steps, the thin film transistor is formed (see FIG. 1D).

Furthermore, a heating treatment may be performed at 100° C. or higher and 200° C. or lower, for one hour or more and 30 hours or less, in air. In this embodiment, the heating treatment is performed at 150° C. for 10 hours. This heat treatment may be performed at a fixed heating temperature, or by repeating a plurality of times the following: raising the temperature from room temperature to a heating temperature of 100° C. or higher and 200° C. or lower, and then lowering the temperature from the heating temperature to room temperature. This heating treatment may be performed under reduced pressure before forming the oxide insulating layer. By performing the heating treatment under reduced pressure, heating time can be shortened. By this heating treatment, a normally-off thin film transistor can be obtained. Furthermore, when a silicon oxide layer with many defects is used for the oxide insulating layer, the impurities contained in the oxide semiconductor layer can be reduced more effectively by this heating treatment.

Note that, by forming the high-resistance drain region 18b (or high-resistance source region 18a) in the oxide semiconductor layer which overlaps with the drain electrode layer 15b (or source electrode layer 15a), reliability of the thin film transistor can be improved. Specifically, by forming the high-resistance drain region 18b, a structure can be obtained in which conductivity gradually changes from the drain electrode layer 15b to the high-resistance drain region 18b and the channel formation region 17. Therefore, in the case that operation is done by connecting the drain electrode layer 15b to a wiring that supplies a high power potential VDD, even when a high electrical field is applied between the gate electrode layer 11 and the drain electrode layer 15b, the high-resistance drain region serves as a buffer and the high electric field is not applied locally; thus, pressure resistance of the transistor can be improved.

Furthermore, the high-resistance source region or the high-resistance drain region in the oxide semiconductor layer is formed in the entire thickness direction in the case that the thickness of the oxide semiconductor layer is thin, as in 15 nm or less. In the case that the thickness of the oxide semiconductor layer is thick, as in 30 nm or more and 50 nm or less, resistance is reduced in a portion of the oxide semiconductor layer, that is, in a region in contact with the source electrode layer or the drain electrode layer and a periphery thereof thereby forming the high-resistance source region or the high-resistance drain region, and a region in the oxide semiconductor layer that is close to the gate insulating layer can be made to be i-type.

A protective insulating layer may also be formed over the oxide insulating layer 16. For example, a silicon nitride layer is formed using an RF sputtering method. The RF sputtering method is preferable as a film formation method of the protective insulating layer because it has favorable productivity. For the protective insulating layer, an inorganic insulating layer that does not contain an impurity such as moisture, hydrogen ions, or OH⁻, and blocks such an impurity from entering from outside is used, such as a silicon nitride layer, an aluminum nitride layer, a silicon nitride oxide layer, or an aluminum nitride oxide layer.

Figure 1C:
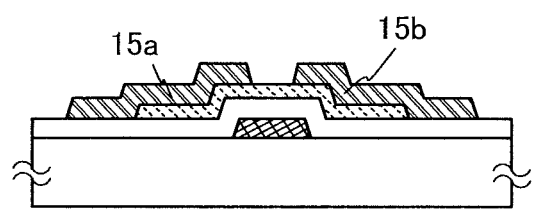
Figure 1D:
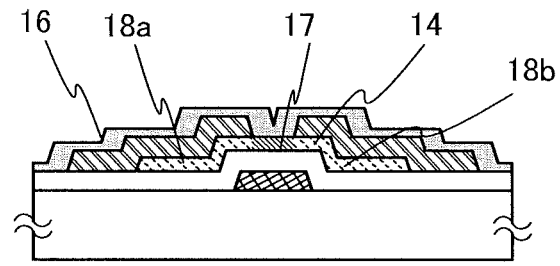

Next, as shown in FIG. 1C, by forming over the oxide insulating layer 16 a conductive layer using one or a plurality of a metal with a characteristic of easily storing or adsorbing moisture, a hydroxyl group, or hydrogen, and then patterning the conductive layer, the back gate electrode layer 19 is formed in a position that overlaps with the oxide semiconductor layer 14. In one embodiment of the present invention, ITO (Indium-Tin-Oxide), which transmits ultraviolet light, is used in order to perform data writing by performing ultraviolet irradiation on an active layer. The back gate electrode layer is not limited thereto, and an open portion formed by etching away a portion of a generic metal thin layer may be provided. It is necessary that the open portion be provided in a position that corresponds to a channel portion of the oxide semiconductor layer. However, it is unnecessary to provide the open portion in the entire the channel portion. With this, because ultraviolet light can be transmitted through the open portion at the same time as maintaining a function as a back gate, the oxide semiconductor layer can be irradiated with ultraviolet light through the back gate therebetween.

Next, after forming the back gate electrode layer 19, by performing a heating treatment in a reduced pressure atmosphere or in an inert gas atmosphere while the back gate electrode layer 19 is exposed, an activation treatment is performed for removing moisture, oxygen, or the like that is adsorbed on a surface of or inside the back gate electrode layer 19.

By performing the above activation treatment, an impurity such as moisture, a hydroxyl group, or hydrogen that exists inside the oxide semiconductor layer 14, inside the gate insulating layer 12, on an interface of the oxide semiconductor layer 14 and the gate insulating layer 12 and a periphery thereof, or on an interface of the oxide semiconductor layer 14 and the oxide insulating layer 16 and a periphery thereof is stored or adsorbed on the back gate electrode 19 that is activated, and the above impurity can be prevented from degrading a transistor characteristic. Furthermore, by desorption of moisture, a hydroxyl group, hydrogen, or the like, carrier concentration of the oxide semiconductor layer 14 can be increased, thereby increasing hole mobility.

In addition, an impurity such as moisture or hydrogen contained in an atmosphere in which a semiconductor device is placed can be prevented from being taken into the oxide semiconductor layer 14. In this embodiment, a heating treatment is performed for 10 minutes in a state where a temperature is 400° C. and a substrate temperature is at an above-mentioned temperature, while maintaining a reduced pressure atmosphere with a degree of vacuum of $5 \times 10^{-3}$ Pa or less and preferably $10^{-5}$ Pa or less inside a treatment chamber using an evacuation method such as a turbomolecular pump.

Note that, the heating treatment for activation is performed in a state where the oxide semiconductor layer 14 is in contact with the oxide insulating layer 16. Therefore, resistance of a region of the oxide semiconductor layer 14 that is in contact with the oxide insulating layer 16 is increased evenly, thereby reducing variation in an electrical characteristic of the thin film transistor.

Figure 1E:
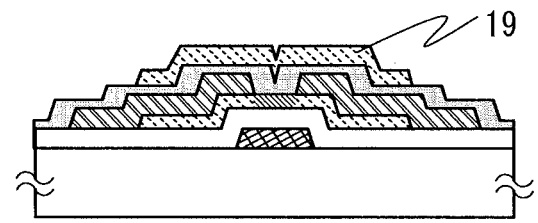

Note that, although the case in which the back gate electrode layer 19 matches the oxide semiconductor layer 14 is shown in FIG. 1E, the present invention is not limited to this structure. By the back gate electrode layer 19 completely covering the entire oxide semiconductor layer 14, an effect of reducing an impurity in the oxide semiconductor layer 14 is enhanced. However, the above effect can also be obtained by at least an entire portion of the oxide semiconductor layer 14 serving as a channel formation region or a portion thereof overlapping the back gate electrode layer 19.

Furthermore, the back gate electrode layer 19 may be electrically insulated and in a floating state, or may be in a state where it is supplied with potential. In the case of the latter, the back gate electrode layer 19 may be supplied with the same potential as the gate electrode layer 11, or may be supplied with a fixed potential such as a ground potential. By controlling the level of potential supplied to the back gate electrode 19, threshold voltage of the thin film transistor can be controlled. By providing a back gate in this manner, a threshold of the thin film transistor including an oxide semiconductor does not shift to a negative side in an initial state (before ultraviolet light irradiation), and an OFF state can be stably maintained at a gate voltage of 0 volts.

Figure 2:
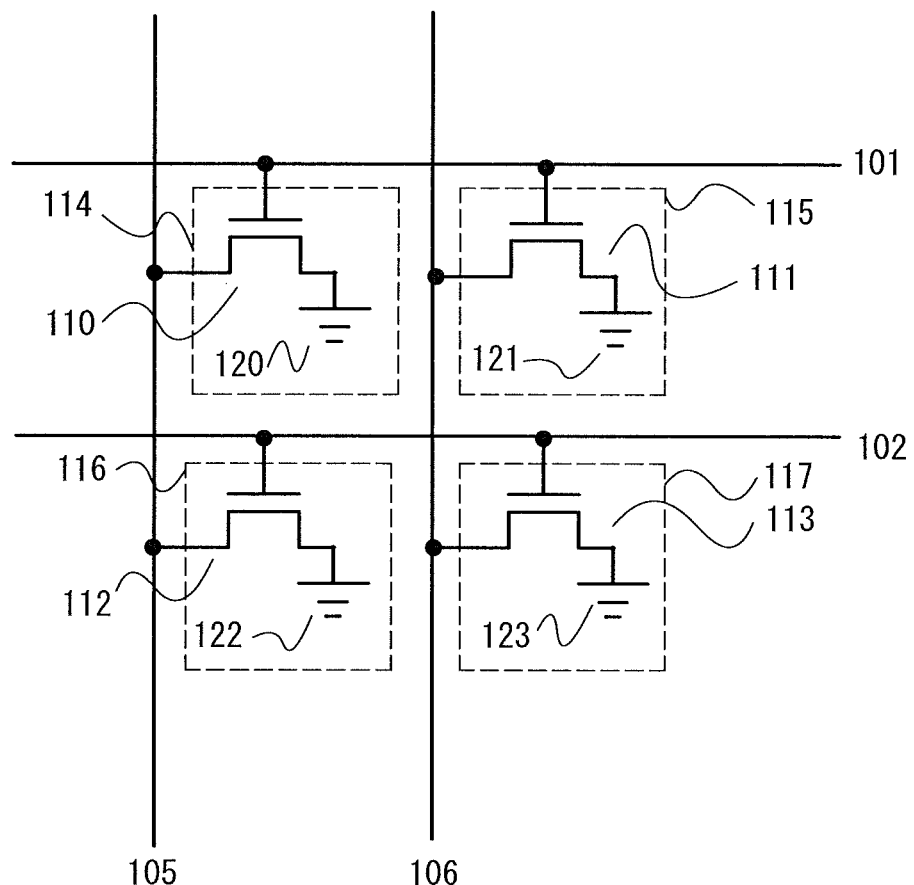
FIG. 2 illustrates a memory cell array which is one embodiment of the present invention.

A memory cell array as shown in FIG. 2 is formed using as an active layer a thin film transistor that has an oxide semiconductor provided with such a back gate. Although FIG. 2 shows an example of a 4-bit memory cell array, the memory cell array is not limited thereto, and may have a large number of bits. A first word line 101 and a second word line 102 extending in one direction (horizontal direction in FIG. 2), and a first bit line 105 and a second bit line 106 extending in another direction (vertical direction in FIG. 2) are provided, and the word lines and the bit lines are orthogonal to each other with a gate insulating layer interposed therebetween. A portion determined by the first word line 101 and the first bit line 105 is called a first bit 114; a portion determined by the first word line 101 and the second bit line 106 is called a second bit 115; a portion determined by the second word line 102 and the first bit line 105 is called a third bit 116; and a portion determined by the second word line 102 and the second bit line 106 is called a fourth bit 117, and they will be used for explaining data writing and readout of a 4-bit memory cell array. The first bit 114 is provided with a first thin film transistor 110. A gate electrode of the first thin film transistor 110 is electrically connected to the first word line 101, and a source electrode is electrically connected to the first bit line 105. Also, a gate electrode layer of a second thin film transistor 111 of the second bit 115 is electrically connected to the first word line 101, and a source electrode is connected to the second bit line 106. Note that, a drain portion of the first thin film transistor is connected to a ground potential 120 in FIG. 2. Connection of this portion is not limited thereto, and a connection relationship differs depending on a characteristic of the thin film transistor, and in some cases a predetermined potential or a signal is given. The memory cell array has a form in which a word line and a bit line extending in different directions are orthogonal to each other, and a thin film transistor is placed at an intersecting point thereof.

Data writing in the memory cell array by ultraviolet light irradiation is described with reference to FIG. 3. Portions described in FIG. 2 are denoted with the same numerals as in FIG. 2. Data wiring with ultraviolet light is performed on the first thin film transistor 110 of the first bit and a fourth thin film transistor 113 of the fourth bit. At that time, a first mask 200 is placed over the second thin film transistor 111 of the second bit. In the same manner, a second mask 201 is placed over a third thin film transistor 112 of the third bit which is connected to the second word line 102 and the first bit line 105. For the masks, a material that does not transmit ultraviolet light is used. The thin film transistors can be shielded from light by placing over the memory cell array a photomask glass provided with a lamination of metal thin films of chromium and chromium oxide as a light shield. Alternatively, aluminum, gold, titanium, tungsten, or the like can be used for the metal thin film. In addition, an organic or inorganic pigment such as black ink, silver paste, gold paste, or carbon paste can be used over a desired thin film transistor by using screen printing or an inkjet. It is desirable that a mask material is a material that can block ultraviolet light with a wavelength of 400 nm or less to a transmittance of 5% or less, desirably 0.5% or less. Although a required thickness differs depending on the material, 200 nm is sufficient for a metal thin film, and 10 to 50 microns is sufficient for a printing method. Furthermore, although a shape of the mask is a square in FIG. 2, the shape is not limited thereto, and it may be a round or triangular shape. It is desirable to shield at least a channel portion of the thin film transistor, and normally the entire semiconductor layer, from light.

After the masks are formed over the desired thin film transistors, the memory cell array is irradiated with ultraviolet lights 210 and 211. Although two arrows are marked in FIG. 3, ultraviolet light irradiation is not limited thereto, and may be performed evenly on the entire memory cell array. At that time, top surfaces of the first mask 200 and the second mask 201 are also subjected to ultraviolet light irradiation. If mask formation is performed adequately in a manner described previously, the thin film transistors 111 and 112 under the masks are not irradiated with ultraviolet light. Also, when ultraviolet light is introduced through a glass fiber or the like, a beam radius can be made to be 1 to 10 mm, and in some cases 20 to 50 mm, which is extremely convenient in that work can be done by holding the glass fiber by hand. Furthermore, when ultraviolet light can be introduced from an optical microscope with an ultraviolet laser as a light source, light can be focused using an optical lens, and direct irradiation can be done on only the intended thin film transistor, without a mask.

As an ultraviolet light irradiation apparatus, a low-pressure mercury lamp or a high-pressure mercury lamp is used. Dominant wavelengths of a low-pressure mercury lamp are 184.9 nm and 253.7 nm. A high-pressure mercury lamp emits ultraviolet light that has a dominant wavelength of 365 nm. Illuminance required for writing is 0.2 to 20 mW/cm$^2$, or 20 to 200 mW/cm$^2$. Energy at that tune is 5 to 200 mJ/cm$^2$. However, energy is not limited thereto, and sufficient energy of 200 to 2000 mJ/cm$^2$ may be supplied. Also, although it is shown that ultraviolet light irradiation is performed from above the thin film transistors in FIG. 3, direction of ultraviolet light irradiation changes depending on a device structure of the array. In the case of a bottom-gate TFT, because a semiconductor layer that is an active layer is formed over a gate electrode, a mask is provided over a top portion thereof and the thin film transistor is irradiated with ultraviolet light from above. With this, the channel portion is irradiated with ultraviolet light and excitation easily occurs in the semiconductor layer. Also, with a top-gate TFT structure, because a gate insulating layer and a gate electrode are formed above the semiconductor layer, the channel portion cannot be irradiated with ultraviolet light efficiently from above the array. In this case, a mask layer is formed over a rear surface of a substrate (a surface that is opposite a surface over which the thin film transistor is formed), and ultraviolet light irradiation is performed on the rear surface. In this case, a material of the substrate is preferably a material that sufficiently transmits ultraviolet light, such as glass or quartz.

Regarding a memory cell array in which desired data is written in this manner, due to concern of having the same effect as data writing by being exposed to a wavelength that includes ultraviolet light such as general light, external light, and solar light for a long period of time, it is desirable to perform sealing or coating to prevent ultraviolet light exposure.

Figure 4A:
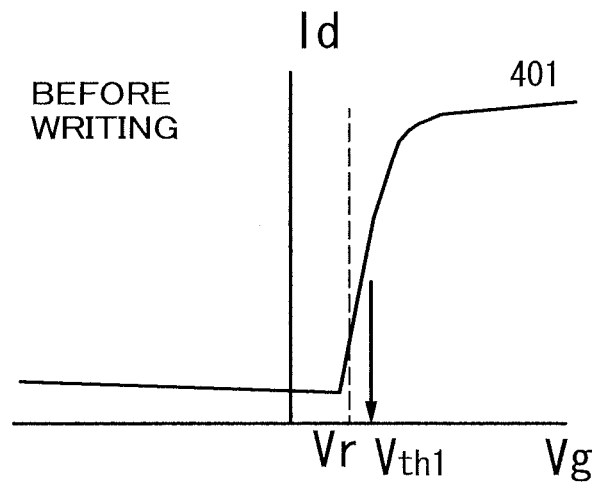
FIGS. 4A and 4B each illustrate an electrical characteristic of a thin film transistor which is one embodiment of the present invention.
Figure 4B:
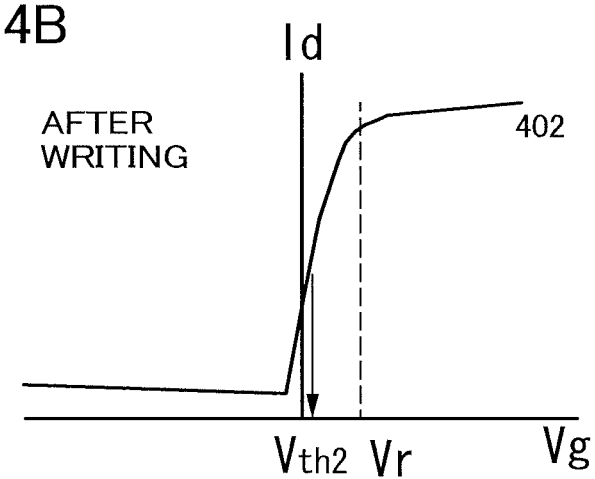

An example of an Id-Vg characteristic of a thin film transistor in which a back gate electrode layer is formed is shown in FIGS. 4A and 4B. An Id-Vg characteristic 401 of the thin film thin film transistor before writing by ultraviolet light irradiation is a measurement of current between drain-source when a gate voltage of −20 to +20 Volts is applied while in a state where a ground potential is applied to a source portion and 10 Volts is applied to a drain portion. When the gate voltage is negative, a current value is stable at $1 \times 10^{-12}$ to $1 \times 10^{-13}$ A, and by the time the gate voltage becomes positive, the current value drastically increases to $10^{-3}$ to $10^{-2}$ A. A voltage when a current shift is largest is called a threshold (expressed as Vth1 volts). At this time, the threshold Vth1 is 1.5 to 4 volts, the current is $10^{-12}$ A or less at a gate voltage of 0 volts, and comes to a complete normally-Off state.

An Id-Vg characteristic 402 of the thin film transistor irradiated with ultraviolet light is described. Although there is not much difference in overall measurement curve from before writing, threshold (represented by Vth2 volts) after writing is −3 to 1 volt, which is a shift on a negative side by 2 to 4 volts compared to the threshold before irradiation. Therefore, current flows between drain-source with a smaller gate voltage. This shift in threshold does not return to Vth1 with passage of time, and the shift is maintained.

As an oxide semiconductor layer 130, the following may be used: an In—Ga—Zn—O-based oxide semiconductor layer; an In—Sn—O-based oxide semiconductor layer; an In—Sn—Zn—O-based oxide semiconductor layer; an In—Al—Zn—O-based oxide semiconductor layer; a Sn—Ga—Zn—O-based oxide semiconductor layer; an Al—Ga—Zn—O-based oxide semiconductor layer; a Sn—Al—Zn—O-based oxide semiconductor layer; an In—Zn—O-based oxide semiconductor layer; a Sn—Zn—O-based oxide semiconductor layer; an Al—Zn—O-based oxide semiconductor layer; an In—O-based oxide semiconductor layer; a Sn—O-based oxide semiconductor layer; or a Zn—O-based oxide semiconductor layer. Each of these materials has been traditionally used for a transparent electrode, and has an energy gap of about 3 eV. For example, the energy gap of an In—Ga—Zn—O-based monocrystalline thin film is 3.15 eV, and corresponds to light with energy with a wavelength of 390 nm. Accordingly, a thin film transistor using such an oxide semiconductor in a semiconductor layer is easily excited by ultraviolet light irradiation, makes a donor level in the semiconductor layer, and easily causes threshold shift. The thin film transistor continues to be in a stable state after shifting, and a memory device utilizes this characteristic.

In the thin film transistor in which data is written with ultraviolet light and the thin film transistor without writing, because they have different thresholds, when a voltage Vr (this voltage is called a readout voltage Vr) which is between the two thresholds Vth1 and Vth2 is selected and applied to the gate voltage, the Id-Vg characteristic 401 of the thin film transistor before writing come to have a high resistance value between the source electrode layer and the drain electrode layer and comes to an OFF state, and the Id-Vg characteristic 402 of the thin film transistor comes to have a low resistance value between the source electrode layer and the drain electrode layer and an ON state is obtained. The larger the difference in resistance values between the ON state and the OFF state, the better the precision of the memory device. When writing voltage is applied, although it is desirable that resistance values have a difference of 6 digits or more, a memory device can function sufficiently with a difference of about 2 to 3 digits. This can be utilized as a memory device.

Figure 5:
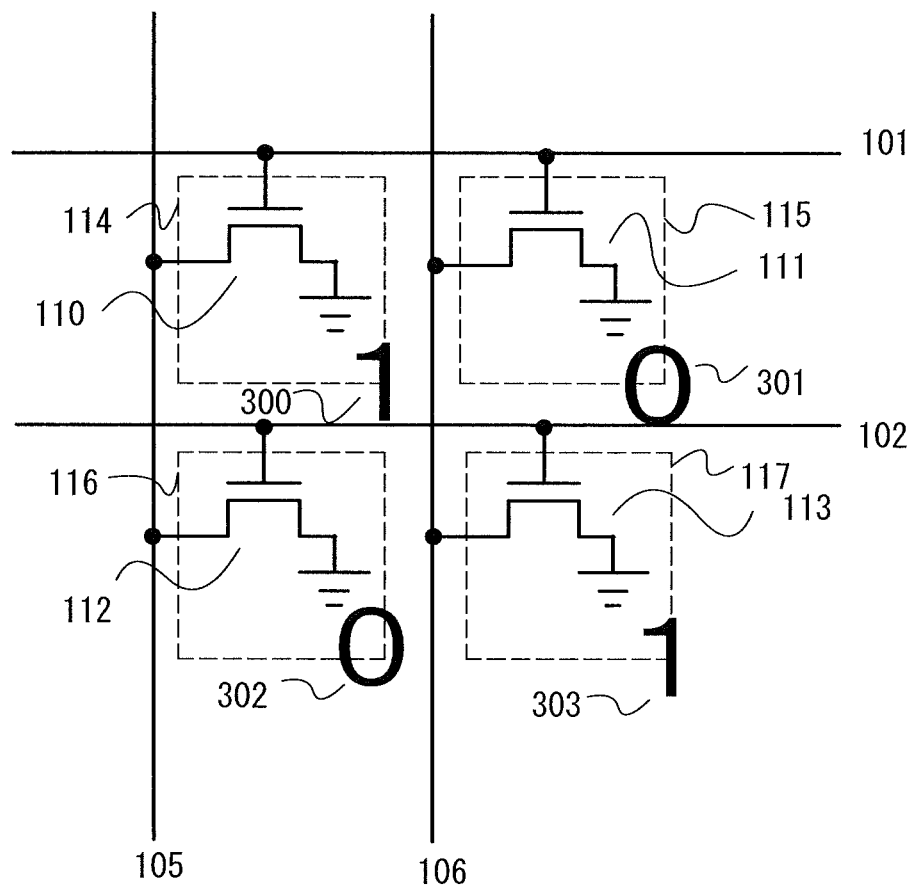
FIG. 5 illustrates data of a memory cell array which is one embodiment of the present invention.

FIG. 5 shows a state of writing data into the memory cell array. The second bit 115 and the third bit 116 which has been masked and not irradiated with ultraviolet light remain with "0" data 301 and 302, but the first bit 114 and the fourth bit 117 subjected to ultraviolet light irradiation have "1" data 300 and 303 written in them. In this manner, data of "1001" is written in the 4-bit memory cell array. Although there is no change in terms of a broad view caused by writing by ultraviolet light irradiation, "1001" is written in this 4-bit memory cell array, which is volatilized and data is maintained without disappearing; thus, the device of the present invention is achieved.

Regarding a memory cell array in which desired data is written in this manner, due to concern of having the same effect as data writing by being exposed to a wavelength that includes ultraviolet light such as general light, external light, and solar light for a long period of time, it is desirable to perform sealing or coating to prevent ultraviolet light exposure.

Figure 6:
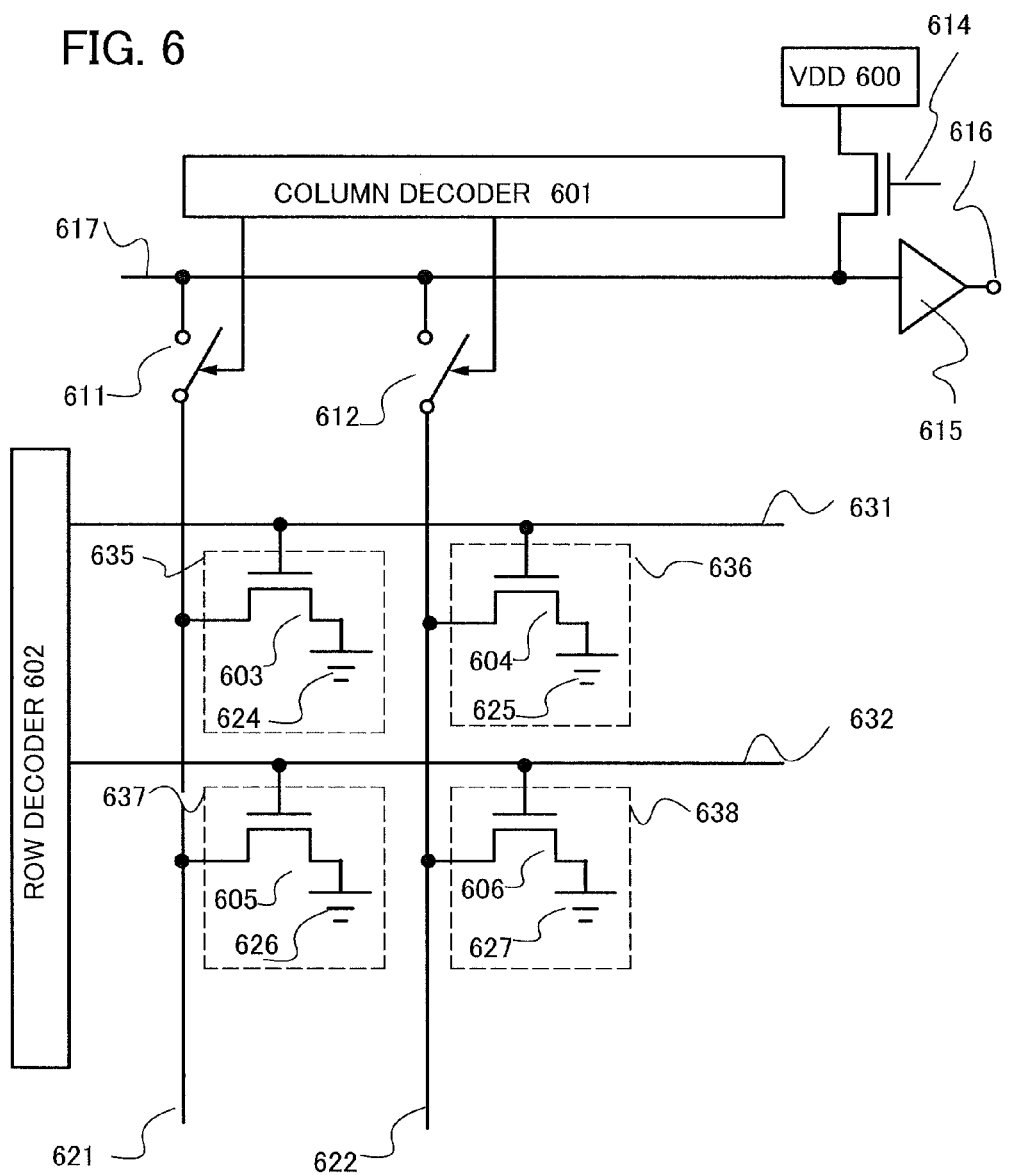
FIG. 6 illustrates data readout from a memory cell array provided with a peripheral circuit which is one embodiment of the present invention.

A memory cell array provided with a peripheral circuit is shown in FIG. 6. How data is read out from a memory cell array in which data is written will be explained. As already explained in FIGS. 2, 3 and 5, data is already written in the memory cell array including the thin film transistor including an oxide semiconductor. FIG. 6 may be thought of as a similar diagram to those in FIGS. 2, 3, and 5 but with a peripheral circuit added thereto. Although the 4-bit memory circuit is shown as the memory element circuit for the sake of simplicity, the memory circuit is not limited to 4 bits. The memory element circuit shown in FIG. 6 includes a column decoder 601; a row decoder 602; an amplifier 615; thin film transistors 603, 604, 605, and 606 each having an oxide semiconductor in an active layer; bit lines (data lines) 621 and 622; word lines 631 and 632; a VDD 600 which is a power source; column switches 611 and 612; an output wiring 617; a thin film transistor 614 which serves as a fixed resistance for potential measurement; and an output terminal 616. A gate electrode and a source electrode of the first thin film transistor 603 are connected to the word line 631 and the bit line 621, respectively. Although a drain electrode is connected to a ground potential 624 in this diagram, it is not limited thereto, and in some cases a specific potential is given. Gate electrodes and source electrodes of the other thin film transistors 604, 605, and 606 are also connected to respective wirings by the same connection method. A portion determined by the first word line 631 and the first bit line 621 is called a first bit 635; a portion determined by the first word line 631 and the second bit line 622 is called a second bit 636; a portion determined by the second word line 632 and the first bit line 621 is called a third bit 637; and a portion determined by the second word line 632 and the second bit line 622 is called a fourth bit 638, and they will be used for explaining data writing and readout of a 4-bit memory cell array.

In the memory cell array, the data "1001" is already written as described in FIG. 3, and the first bit 635 and the fourth bit 638 each have a data "1" by ultraviolet light. The second bit 636 and the third bit 637 not irradiated with ultraviolet light because of mask formation each have data "0." How memory information is read out from the memory cell array in which the memory information is written will be explained.

The second thin film transistor 604 in the second bit 636 not irradiated with ultraviolet light has the threshold Vth1, and when the readout voltage Vr is applied to the gate electrode, current between the source and the drain is small and an OFF state is obtained. The word line 631 is selected by the row decoder 602, and a readout voltage of 3 Volts, for example, is applied to the gate electrode of the thin film transistor 604. Next, the bit line 622 is selected by the column switch 612 from the column decoder 601, and a power source potential of VDD is applied to the source line of the thin film transistor 604 from the output wiring 617. Because the thin film transistor 604 not irradiated with ultraviolet light has the threshold Vth1, even when the readout voltage Vr is applied to the gate electrode, a current between the source and the drain is small, and resistance value of this portion is large. Therefore, a division of the voltage between the VDD 600 and the ground potential 625 corresponding to the resistances of the first thin film transistor 614 and the second thin film transistor at a certain time may be considered. Voltage applied to the second thin film transistor 604 is high, and voltage applied to the thin film transistor 614 is low. Accordingly, when observation is made with the ground potential 625 as a standard, the amplifier outputs "High."

The first thin film transistor 603 in the first bit 635 in which data is written is considered. In the same manner as before, the first word line 631 is selected by the row decoder. The second column switch 612 in the second thin film transistor is turned off and then the first column switch 611 is turned on, to select the first bit line 621. The potential of VDD is applied to the source portion of the first thin film transistor. The readout voltage Vr is applied to the gate portion. The threshold of the first thin film transistor is Vth2, and because the readout voltage Vr which is larger that Vth2 is applied, the current between the source and the drain flows towards the ground potential 624. That is, the resistance value of the first thin film transistor 603 is small. Accordingly, voltage applied between the source and the drain in the first thin film transistor is low, and a high voltage is applied to the thin film transistor 614. Potential on a first bit 635 side becomes low. At that time, the amplifier 615 outputs "Low." In a similar manner, when the second word line 632 is selected and VDD is applied to the source line, the third bit in which writing is not performed has "High" as an output, and the fourth bit in which writing is performed has "Low" as an output.

On the other hand, a case when the word line is not selected is considered. When the word line is not selected, the word line has a smaller voltage than the readout voltage Vr, such as 0 volts. The fourth thin film transistor 606 in the fourth bit 638 in which data is written is considered. While the second word line 632 is not selected, the column switch 612 is connected and VDD is applied to a source side. 0 volts is applied to the gate electrode that is not selected. In the fourth thin film transistor with this gate voltage, current does not flow between the source and the drain, and resistance in this portion is high. Accordingly potential on the fourth bit is large, and the amplifier outputs "High."

Operation during non selection of the third thin film transistor 605 in the third bit 637 without data writing is considered. When the second word line 632 is not selected, a voltage of 0 volts is applied to the gate electrode of the third thin film transistor 605. The column switch 611 becomes connected, and VDD is applied to the source line through the first bit line 621. When the gate electrode is not selected, 0 volts is applied to the gate electrode. With this gate voltage, current does not flow between the source electrode and the drain electrode of the third thin film transistor, and resistance of this portion is high. Therefore, potential in the third bit becomes high, and the amplifier outputs "High." In a similar manner, when the first word line is not selected, the first bit 635 and the second bit 636 also output "High."

In this manner, the data "1001" that is written in the first bit to the fourth bit of the memory cell array is read out as "Low, High, High, Low," and it is output by the amplifier. Furthermore, when a word line is not selected, regardless of whether there is writing or not, "High" is output. That is, when a word line selects a bit in which writing is performed and reads it out, "Low" is output, and when a bit in which writing is not performed is read out or when a word line is not selected, "High" is output regardless of whether there is data written. By the above scheme working properly, readout can be performed accurately when a memory cell array including a matrix of a plurality of word lines and bit lines is formed.

Figure 7:
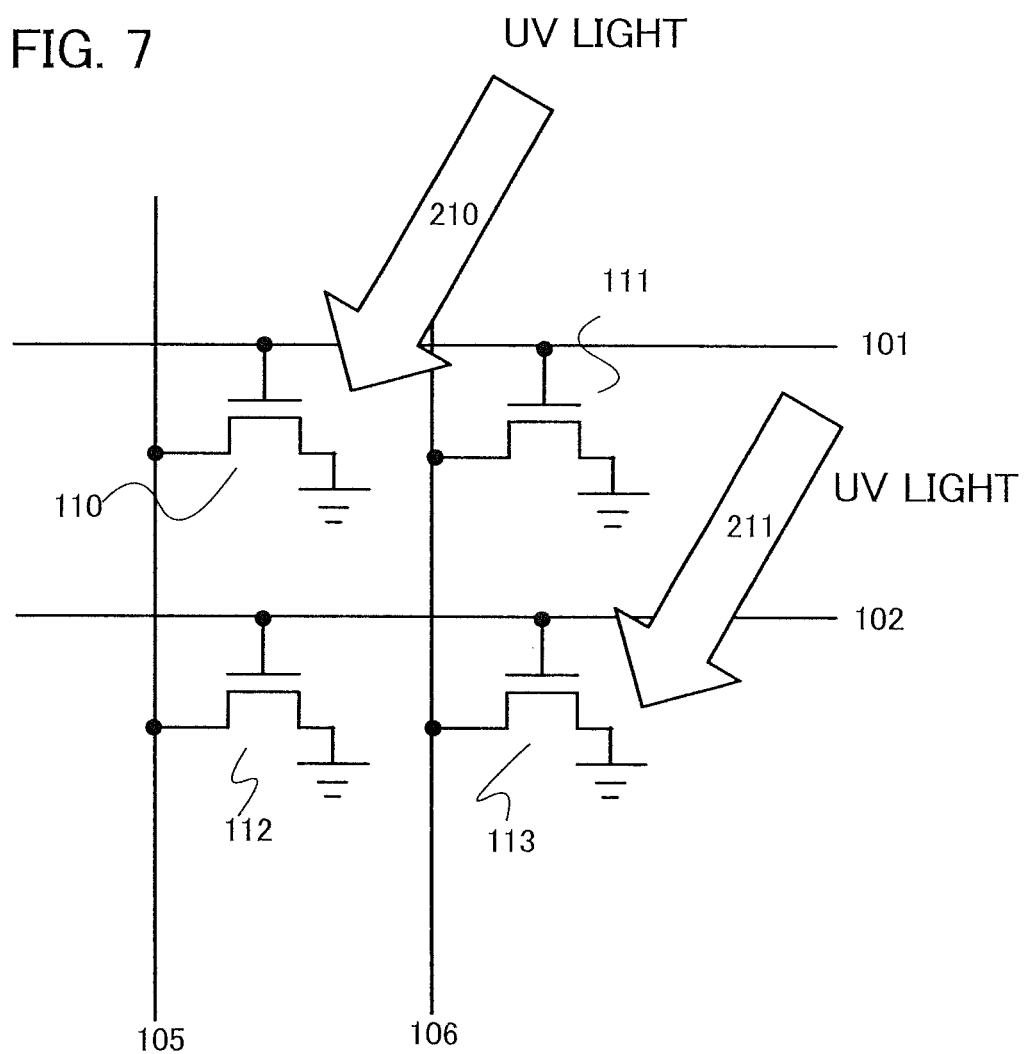
FIG. 7 illustrates a method of erasing data from a memory cell array which is one embodiment of the present invention.
Figure 8:
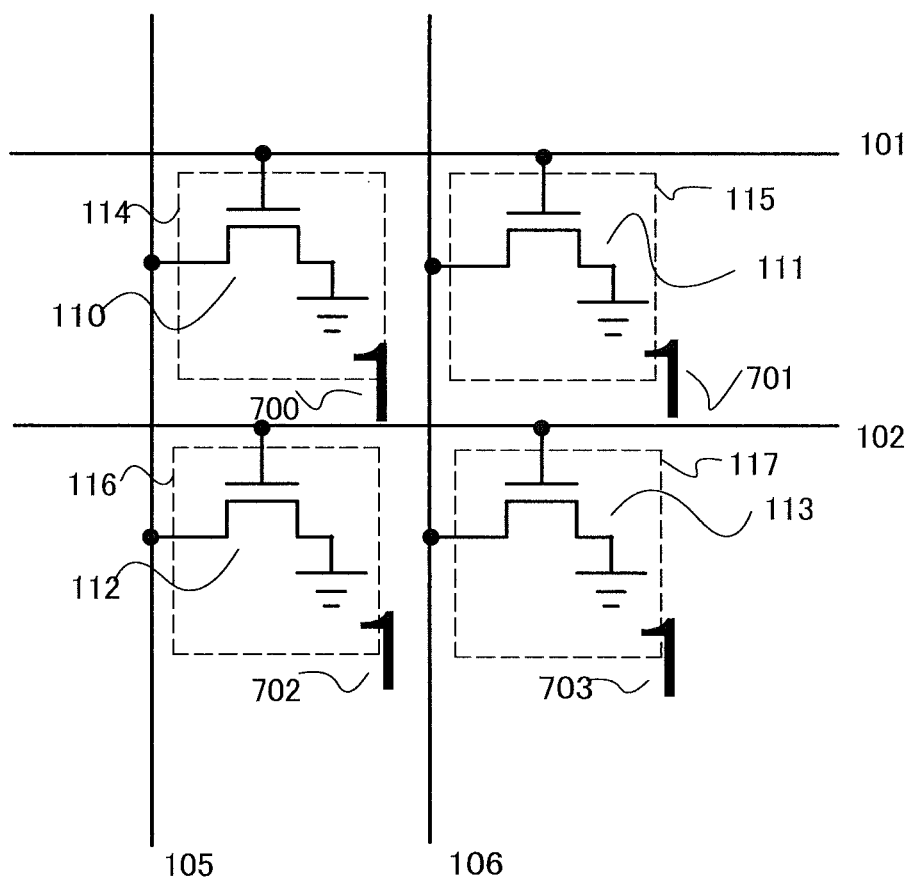
FIG. 8 illustrates erased data of a memory cell array which is one embodiment of the present invention.

When the memory cell array in which data "1001" is held is destroyed, with the data "1001" still left therein, it is causes concern from a stand point of preventing confidential information leakage. Therefore, when the memory cell array is destroyed, the recorded data is desirably erased in one time. As shown in FIG. 7, data can be erased by writing in all of the bits by irradiating the entire surface evenly with the ultraviolet lights 210 and 211 without a mask. As a result, as shown in FIG. 8, data of "1111" is written, and the data "1001" that has been there to that point is completely erased. Although writing is performed twice in the thin film transistors 110 and 113, a record thereof is not particularly left behind, and only the data "1111" remains in the memory cell array.

(Embodiment 2)

An embodiment in which another thin film transistor is provided inside a bit in addition to a thin film transistor including an oxide semiconductor will be explained. If the thin film transistor including an oxide semiconductor has an n-channel type electrical characteristic, a thin film transistor with a p-channel type electrical characteristic is used, which is the opposite polarity. With the p-channel type electrical characteristic, small current flows between a source and a drain when a positive voltage is applied to a gate electrode layer and large current flows when a negative voltage is applied. That is, it has a switching characteristic, by which an OFF state is obtained when a positive voltage is applied and an ON state is obtained when a negative voltage is applied. Furthermore, the n-channel thin film transistor has the opposite operation where an OFF state is obtained with a negative voltage and an ON state is obtained with a positive voltage. If the thin film transistor with an oxide semiconductor is an n-channel type, then a p-channel type thin film transistor is used in this embodiment. The p-channel type thin film transistor is applied as a solution when control of a threshold of the thin film transistor with an oxide semiconductor is difficult. Note that there is not problem with applying this embodiment to the thin film transistor including an oxide semiconductor described in Embodiment 1 which threshold is controlled by providing the back gate electrode layer.

Figure 9:
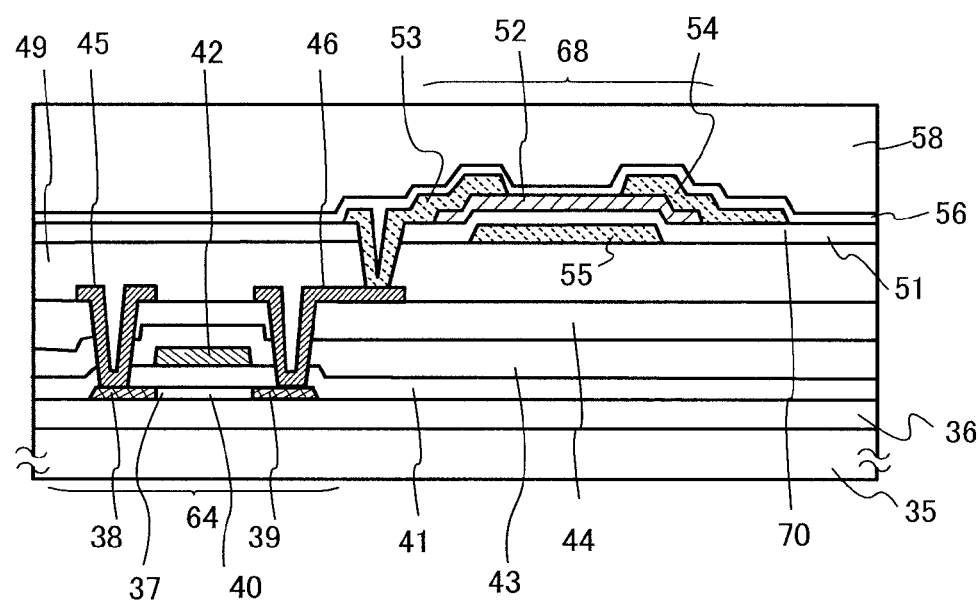
FIG. 9 illustrates a thin film transistor which is one embodiment of the present invention and a manufacturing method thereof.

FIG. 9 shows a cross-sectional structure of an element. In using FIG. 9 for explanation, the p-channel type thin film transistor is called a first thin film transistor and the thin film transistor with an oxide semiconductor layer is called a second thin film transistor. Also, a gate electrode layer 42 of the first thin film transistor is called a first gate electrode layer to differentiate from a second gate electrode layer 55 which is a gate electrode layer of the second thin film transistor.

A first thin film transistor 64 includes a silicon layer 37 with a first channel 40; a first gate insulating layer 41; the first gate electrode layer 42; a first source electrode layer 45; and a first drain electrode layer 46. Reference numeral 38 denotes one of a first source region and a first drain region, and 39 denotes the other of the first source region and the first drain region.

The first thin film transistor 64 is provided over an insulating layer 36 which is a base film. The insulating layer 36 prevents an impurity such as a metal ion contained in a substrate 35 from entering the first thin film transistor 64 and the second thin film transistor 68. The silicon layer 37 is provided over the insulating layer 36. The first gate insulating layer 41 is provided over the silicon layer 37. The first gate electrode layer 42 is provided over the first gate insulating layer 41. The first source electrode layer 45 and the first drain electrode layer 46 are provided over the silicon layer 40 so as to be in contact with the first source region 38 and the first drain region 39, respectively. Note that although a top-gate-type thin film transistor is shown here as the first thin film transistor 64, a bottom-gate-type thin film transistor may be used instead. Furthermore, a plurality of the first thin film transistors may be used instead of being limited to one.

The first gate electrode layer 42 is electrically connected to a word line (not shown in the figure). Also, the first gate electrode layer 42 may be a part of the word line.

The first source electrode layer 45 is electrically connected to a first bit line (not shown in the figure). Furthermore, the first drain electrode layer 46 is electrically connected to a second source electrode layer 53 of the second thin film transistor.

The second thin film transistor 68 will be explained. The second thin film transistor 68 includes the second gate electrode layer 55; a second gate insulating layer 51; an oxide semiconductor layer 52; and the second source electrode layer 53 and a second drain electrode layer 54.

The second thin film transistor 68 is provided over an interlayer insulating layer 49. The second gate electrode layer 55 is provided over the interlayer insulating layer 49. The second gate insulating layer 51 is provided over the second gate electrode layer 55. The oxide semiconductor layer 52 is provided over the second gate insulating layer 51. The second source electrode layer 53 and the second drain electrode layer 54 are provided over the oxide semiconductor layer 52 so as to be in contact thereto. Over the second source electrode layer 53, the second drain electrode layer 54, the oxide semiconductor layer 52, and the second gate insulating layer 51, an insulating layer 56 is provided as a passivation film. Furthermore, the second gate electrode layer 55 may be formed at the same time as the first gate electrode layer 42, or at the same time as the first source electrode layer 45 and the drain electrode layer 46. By doing so, the number of steps is reduced. Note that although a bottom-gate-type transistor is shown here as the second thin film transistor 68, a top-gate-type transistor may be used instead.

The second gate electrode layer 55 is electrically connected to a word line. Alternatively, the second gate electrode layer 55 may be a part of the word line (not shown in the figure).

The second source electrode layer 53 is electrically connected to the first thin film transistor 64 and the first drain electrode layer 46. Also, the second drain electrode layer 54 is connected to a predetermined potential (not shown in the figure).

The substrate 35 has heat resistance that is high enough to withstand a heating treatment that is performed later. As the substrate 35, a glass substrate of barium borosilicate glass, aluminoborosilicate glass or the like is used. Alternatively, the substrate 35 may be a substrate made of an insulator, such as a ceramic substrate, a quartz substrate, a sapphire substrate, or a crystallized glass substrate. Alternatively, a plastic film or the like formed using polyethylene terephthalate, polyimide, an acrylic resin, polycarbonate, polypropylene, polyester, polyvinyl chloride, or the like may be used as long as it has heat resistance high enough to withstand the heat treatment that is performed later.

For the insulating layer 36, a silicon oxide layer, a silicon nitride layer, a silicon oxynitride layer or the like is used. A thickness of the insulating layer 36 may be 10 to 200 nm The silicon layer 37 is a monocrystalline silicon layer or a crystalline silicon layer. The thickness of the silicon layer 37 may be 2 nm or more and 200 nm or less. The silicon layer 37 contains a channel-type impurity element, and regions containing this impurity element becomes the first source region and first drain regions 38 and 39. The channel 40 is between the first source region and the first drain region 38 and 39. The silicon layer 37 may include an LDD region as needed. Instead of a silicon layer, a layer made of germanium, silicon-germanium, gallium arsenide, silicon carbide, or the like may be used.

The first gate insulating layer 41 is formed as a single layer selected from the following layers or as a laminated layer of one or more types of the following layers: a silicon oxide layer, a silicon nitride layer, a silicon oxynitride layer, a silicon nitride oxide layer, an aluminum oxide layer, a $Y_2O_3$ layer, and a $HfO_2$ layer. The thickness of the first gate insulating layer 41 may be 10 to 500 nm The first gate electrode layer 42 is formed as a single layer or laminated layer using a metal material such as molybdenum, titanium, chromium, tantalum, tungsten, aluminum, copper, neodymium, or scandium; or an alloy material containing any of these materials as a main component. The thickness of the first gate electrode layer 42 may be 10 to 200 nm.

Each of the first source electrode layer 45 and the first drain electrode layer 46 is formed as a single layer or laminated layer using a metal material such as molybdenum, titanium, chromium, tantalum, tungsten, aluminum, copper, neodymium, or scandium; or an alloy material containing any of these materials as a main component. The thickness of each of the first source electrode layer 45 and the first drain electrode layer 46 may be 100 to 500 nm.

An interlayer insulating layer 43 is formed, for example, as a single layer selected from the following layers or a laminated layer of one or more types of the following layers: a silicon oxynitride layer; a silicon nitride oxide layer; an aluminum oxide layer; an $Y_2O_3$ layer; and a $HfO_2$ layer. The thickness of the interlayer insulating layer 43 may be 10 to 200 nm.

For each of an interlayer insulating layer 44 and the interlayer insulating layer 49, a silicon oxide layer, a silicon nitride layer, a silicon oxynitride layer, or the like is used. It is preferable that the interlayer insulating layers 44 and 49 do not contain hydrogen, a hydroxyl group, or moisture. The thickness of each of the interlayer insulating layers 44 and 49 may be 10 nm to 1 Ξm. The second gate insulating layer 51 is formed as a single layer selected from the following layers or as a laminated layer of one or more types of the following layers: a silicon oxide layer; a silicon nitride layer; a silicon oxynitride layer; a silicon nitride oxide layer; an aluminum oxide layer; a hafnium silicate ($HfSiO_x$) layer; a hafnium silicate ($HfSiO_xN_y$ (x>0, y>0)) layer to which nitrogen is added; a hafnium aluminate ($HfAlO_xN_y$ (x>0, y>0)) layer to which nitrogen is added; a hafnium oxide layer; and an yttrium oxide film. Gate leakage can be reduced by using a high-k material such as a hafnium silicate (HfSiO$_x$) layer; a hafnium silicate (HfSiO$_x$N$_y$) layer to which nitrogen is added; a hafnium aluminate (HfAlO$_x$N$_y$) layer to which nitrogen is added; a hafnium oxide layer; or an yttrium oxide layer. It is preferable that the second gate insulating layer 51 does not contain hydrogen, a hydroxyl group, or moisture. The thickness of the second gate insulating layer 51 may be 10 to 500 nm.

The second gate insulating layer 51 may contain a halogen element (for example, fluorine or chlorine) at a concentration of about $5\times10^{18}$ atoms/cm$^3$ to $1\times10^{20}$ atoms/cm$^3$. With the halogen element, an impurity such as hydrogen, moisture, a hydroxyl group, or a hydride that may be present in the oxide semiconductor layer 52 or at an interface between the second gate insulating layer 51 and the oxide semiconductor layer 52 can be removed. For example, in the case of using a laminated layer of a silicon nitride layer and a silicon oxide layer as the second gate insulating layer 51, a side that comes into contact with the oxide semiconductor layer 52 may be a silicon oxide layer that contains the halogen element with the above concentration. The silicon nitride layer prevents an impurity such as hydrogen, moisture, a hydroxyl group or a hydride (also called a hydrogen compound) from entering the silicon oxide layer.

The oxide semiconductor layer 52 is an amorphous oxide semiconductor layer or a crystalline oxide semiconductor layer, such as an In—Ga—Zn—O-based oxide semiconductor layer; an In—Sn—Zn—O-based oxide semiconductor layer; an In—Al—Zn—O-based oxide semiconductor layer; an Sn—Ga—Zn—O-based oxide semiconductor layer; an Al—Ga—Zn—O-based oxide semiconductor layer; an Sn—Al—Zn—O-based oxide semiconductor layer; an In—Zn—O-based oxide semiconductor layer; an Sn—Zn—O-based oxide semiconductor layer; an Al—Zn—O-based oxide semiconductor layer; an In—O-based oxide semiconductor layer; an Sn—O-based oxide semiconductor layer; or a Zn—O-based oxide semiconductor layer. The thickness of the oxide semiconductor layer 52 may be 2 nm or more and 200 nm or less. A threshold voltage can be adjusted by the kind and composition of the oxide semiconductor layer 52.

It is preferable that the oxide semiconductor layer 52 does not contain hydrogen, a hydroxyl group, or moisture. Specifically, a concentration of hydrogen is $5\times10^{19}$/cm$^3$ or less, preferably $5\times10^{18}$/cm$^3$ or less, and more preferably less than $5\times10^{16}$/cm$^3$. Also, a carrier concentration is less than $1\times10^{12}$/cm$^3$, preferably less than $1\times10^{11}$/cm$^3$. That is, the carrier concentration of the oxide semiconductor layer is extremely close to 0. Furthermore, energy gap is 2 eV or more, preferably 2.5 eV or more, and more preferably 3 eV or more. Note that, hydrogen concentration in the oxide semiconductor layer may be measured by secondary ion mass spectroscopy (SIMS). The carrier concentration may be measured by Hall effect measurement.

Hydrogen is a donor in the oxide semiconductor, and is it known as one factor in causing the oxide semiconductor to become an n-channel type. Therefore, the oxide semiconductor can be made to be intrinsic (i-type) by making the oxide semiconductor highly pure, by removing hydrogen from the oxide semiconductor and making it so that other than a main component of the oxide semiconductor, impurity contained therein is as minimal as possible. It is preferable to obtain a highly purified i-type (intrinsic semiconductor) oxide semiconductor or an oxide semiconductor close to it by removing an impurity such as hydrogen or water as much as possible, not by adding an impurity. A Fermi level (Et) of an oxide semiconductor from which an impurity is removed can be made to be at the same level as an intrinsic Fermi level (Ei).

In the second transistor 68 including the oxide semiconductor layer 52, even when a negative voltage (reverse-biased) is applied to the second gate electrode, an OFF-current is small. This is because the carrier concentration is low, and therefore minority carrier concentration (hole concentration) which contributes to the OFF-current is small.

For example, even when the second transistor 68 has a channel width W of $1\times10^4$ μm and a channel length of 3 μm, an OFF-current is $10^{-13}$ A or less and an S value of 0.1 V/dec. (the thickness of the second gate insulating layer 51 is 100 nm) is obtained.

By highly purifying the oxide semiconductor so that an impurity contained therein other than a main component is minimal as possible, operation of the second transistor 68 can be favorable. In particular, an OFF-current can be reduced.

In the case that a band gap (Eg) of the oxide semiconductor is 3.15 eV, electron affinity ($\chi$) is said to be 4.3 eV. For example, when titanium (Ti) is used for the second source electrode and second drain electrodes 53 and 54, a work function of Ti is approximately equal to the electron affinity ($\chi$) of the oxide semiconductor. In this case, a Shottky-type barrier for electrons is not formed at an interface between the metal (Ti) and the oxide semiconductor. That is, electrons are injected from Ti to the oxide semiconductor layer 52 without adding an n-channel-type impurity to the oxide semiconductor layer 52.

Each of the second source electrode layer 53 and the second drain electrode layer 54 is formed as a single layer or a laminated layer using a metal material such as molybdenum, titanium, chromium, tantalum, tungsten, aluminum, copper, neodymium, or scandium; or an alloy material containing any of these materials as a main component. It is preferable that the second source electrode layer and the second drain electrode layer 53 and 54 do not contain hydrogen, a hydroxyl group, or moisture. The thickness of each of the second source electrode layer and the second drain electrode layer 53 and 54 may be 10 to 500 nm The insulating layer 56 is an oxide insulating layer, and a silicon oxide layer is used for example. It is preferable that the insulating layer 56 does not contain hydrogen, a hydroxyl group, or moisture. The thickness of the insulating layer 56 may be 10 to 200 nm. Not that instead of the silicon oxide layer, a silicon oxynitride layer, an aluminum oxide layer, an aluminum oxynitride layer, or the like can be used.

The insulating layer 56 may contain a halogen element (for example, fluorine or chlorine) at a concentration of about $5\times10^{18}$ atoms/cm$^3$ to $1\times10^{20}$ atoms/cm$^3$. With the halogen element, an impurity such as hydrogen, moisture, a hydroxyl group, or a hydride that may be present in the oxide semiconductor layer 52 or at an interface between the gate insulating layer 51 and the oxide semiconductor layer 52 can be removed.

Figure 10:
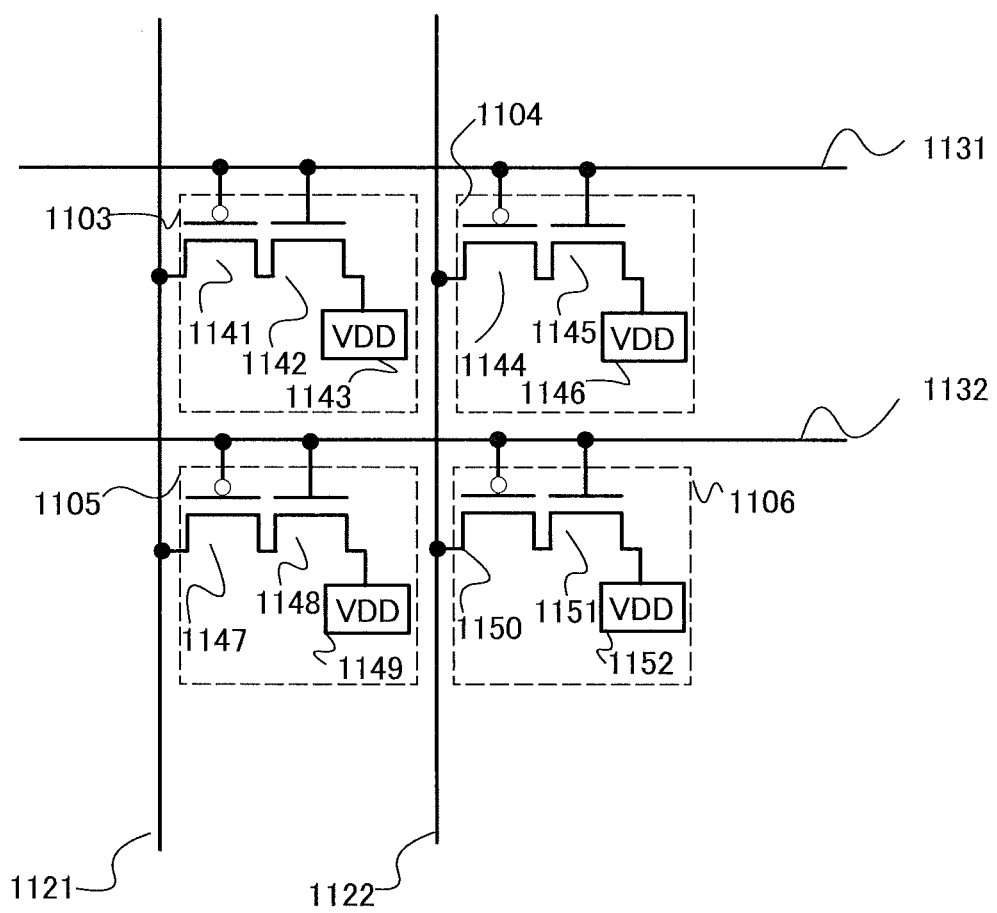
FIG. 10 illustrates a memory cell array which is one embodiment of the present invention.

A memory cell array of the first thin film transistor and the second thin film transistor will be explained with reference to FIG. 10.

A first word line 1131 and a second word line 1132 extend in one direction, and a first bit line 1121 and a second bit line 1122 extend in another direction to form a matrix. In a first bit 1103 where the first word line 1131 and the first bit line 1121 intersect, a first thin film transistor 1141 and a second thin film transistor 1142 are placed. A gate electrode layer of the first thin film transistor 1141 and a gate electrode layer of the second thin film transistor 1142 are both connected to the first word line 1131. A source electrode layer of the first thin film transistor 1141 is connected to the first bit line 1121, a drain electrode layer of the first thin film transistor 1141 is connected to a source electrode layer of the second thin film transistor 1142, and a drain electrode layer of the second thin film transistor 1142 is connected to a potential VDD 1143.

In a second bit 1104 where the first word line 1131 and the second bit line 1122 intersect, a first thin film transistor 1144 and a second thin film transistor 1145 are placed. A gate electrode layer of the first thin film transistor 1144 and a gate electrode layer of the second thin film transistor 1145 are both connected to the first word line 1131. A source electrode layer of the first thin film transistor 1144 is connected to the second bit line 1122, a drain electrode layer of the first thin film transistor 1144 is connected to a source electrode layer of the second thin film transistor 1145, and a drain electrode layer of the second transistor 1145 is connected to a potential VDD 1146.

In a third bit 1105 where the second word line 1132 and the first bit line 1121 intersect, a first thin film transistor 1147 and a second thin film transistor 1148 are placed, and are connected to the second word line and the first bit line in the same manner.

In a fourth bit 1106 where the second word line 1132 and the second bit line 1122 intersect, a first thin film transistor 1150 and a second thin film transistor 1151 are placed, and are connected to the second word line and the second bit line in the same manner.

Figure 11:
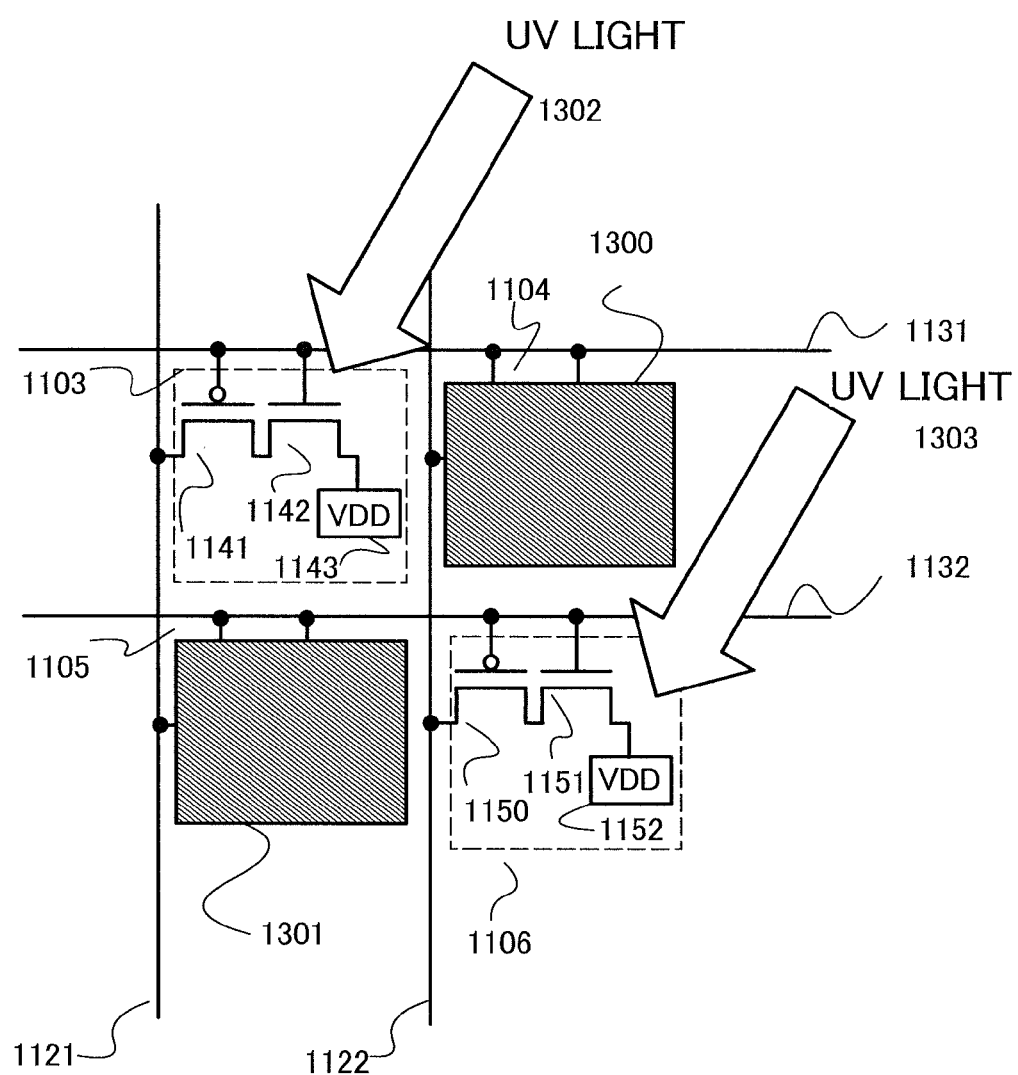
FIG. 11 illustrates a method of writing data into a memory cell array of the present invention.

Data writing by subjecting the memory cell array to ultraviolet light irradiation is explained with reference to FIG. 11. Portions explained in FIG. 10 are denoted by the same reference numerals as those in FIG. 10. The first bit 1103 and the fourth bit 1106 are subjected to data writing by ultraviolet light. Over the second bit 1104 and the third bit 1105, a first mask 1300 and a second mask 1301 are placed. For the masks, a material that does not transmit ultraviolet light is used. The thin film transistors can be shielded from light by placing over the memory cell array a photomask glass provided with a lamination of metal thin films of chromium and chromium oxide as a light shield. Alternatively, aluminum, gold, titanium, tungsten, or the like can be used for the metal thin film. In addition, an organic or inorganic pigment such as black ink, silver paste, gold paste, or carbon paste can be used over a desired thin film transistor by using screen printing or an inkjet. It is desirable that a mask material is a material that can block ultraviolet light with a wavelength of 400 nm or less to a transmittance of 5% or less, desirably 0.5% or less. Although a required thickness differs depending on the material, 200 nm is sufficient for a metal thin film, and 10 to 50 microns is sufficient for a printing method. Furthermore, although a shape of the mask is a square in FIG. 11, the shape is not limited thereto, and it may be a round or triangular shape. Although the masks cover the first thin film transistors as well as the second thin film transistors, the first thin film transistors which are not sensitive to ultraviolet light do not need to be covered. It is preferable that the masks block light from at least channel portions of the second thin film transistors 1142 and 1151 which are each provided with an oxide semiconductor layer that is sensitive to ultraviolet light, and normally the entire semiconductor layer.

After the masks are formed over the desired thin film transistors, the memory cell array is subjected to ultraviolet light irradiation. Although two arrows 1302 and 1303 are marked in FIG. 11, ultraviolet light irradiation is not limited thereto, and may be performed evenly on the entire memory cell array. At that time, top surfaces of the first mask 1300 and the second mask 1301 are also subjected to ultraviolet light irradiation. If mask formation is performed adequately in a manner described previously, the thin film transistors 1145 and 1148 under the masks are not irradiated with ultraviolet light. Also, when ultraviolet light is introduced through a glass fiber or the like, a beam radius can be made to be 1 to 10 mm, and in some cases 20 to 50 mm, which is extremely convenient in that work can be done by holding the glass fiber by hand. Furthermore, when ultraviolet light can be introduced from an optical microscope with an ultraviolet laser as a light source, light can be focused using an optical lens, and direct irradiation can be done on only the intended thin film transistor, without a mask.

Regarding wavelength of the ultraviolet light, a dominant wavelength is 365 nm when a high-pressure mercury lamp is used, and the dominant wavelength is 253.7 nm when a low-pressure mercury lamp is used. Also, although it is shown that ultraviolet light irradiation is performed from above the thin film transistors in FIG. 11, direction of ultraviolet light irradiation changes depending on a device structure of the array. In the case of a bottom-gate TFT, because a semiconductor layer that is an active layer is formed over a gate electrode, a mask is provided over a top portion thereof and the thin film transistor is irradiated with ultraviolet light from above. With this, the channel portion is irradiated with ultraviolet light and excitation easily occurs in the semiconductor layer. Also, with a top-gate TFT structure, because a gate insulating layer and a gate electrode are formed above the semiconductor layer, the channel portion cannot be irradiated with ultraviolet light efficiently from above the array. In this case, a mask layer is formed over a rear surface of a substrate (a surface that is opposite a surface over which the thin film transistor is formed), and ultraviolet light irradiation is performed on the rear surface. In this case, a material of the substrate is preferably a material that sufficiently transmits ultraviolet light, such as glass or quartz.

Regarding a memory cell array in which desired data is written in this manner, due to concern of having the same effect as data writing by being exposed to a wavelength that includes ultraviolet light such as general light, external light, and solar light for a long period of time, it is desirable to perform sealing or coating to prevent ultraviolet light exposure.

Figure 12A:
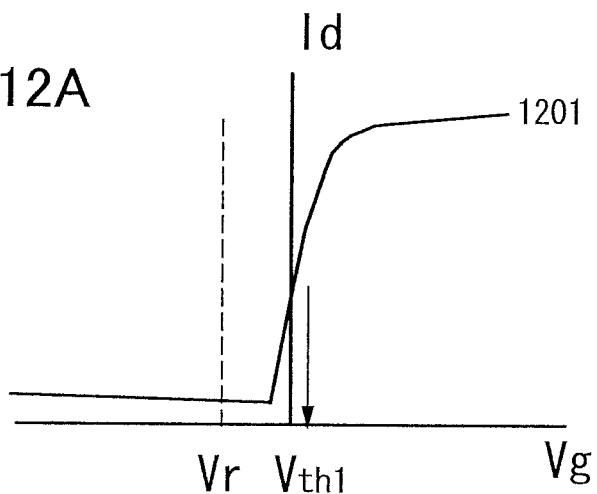
FIGS. 12A to 12C illustrate electrical characteristics of a thin film transistor which is one embodiment of the present invention.
Figure 12B:
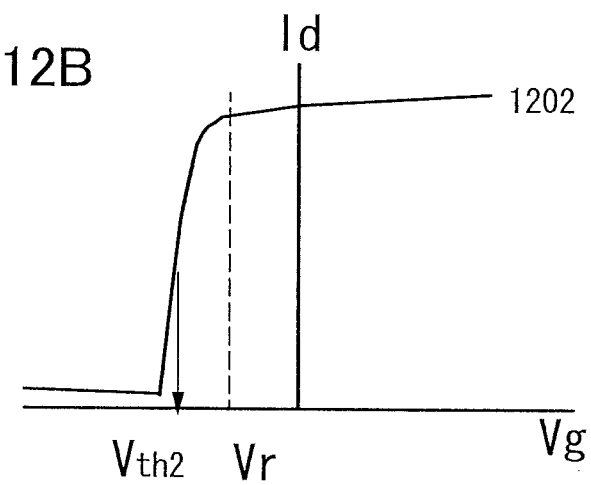
Figure 12C:
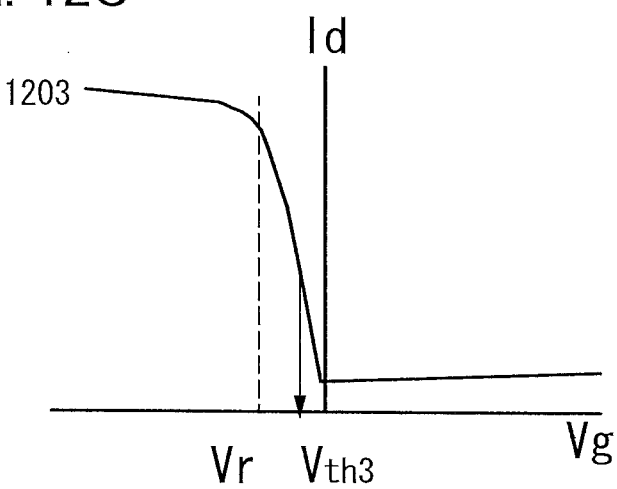

One example of an electrical characteristic of each thin film transistor is described in FIGS. 12A to 12C. FIG. 12A shows an Id-Vg characteristic of the thin film transistor including an oxide semiconductor in an active layer that is not irradiated with ultraviolet light. The threshold Vth1 on an Id-Vg curve 1201 is −2 V to 1 V. The Id-Vg characteristic of a thin film transistor irradiated with ultraviolet light is shown in FIG. 12B. The threshold Vth2 is −6 V to −1 V. The Id-Vg characteristic of a p-channel-type thin film transistor using a silicon layer is shown in FIG. 12C. This has the opposite characteristic from the n-channel-type thin film transistor, and when gate voltage is positive, the current is $1\times10^{-12}$ A to $1\times10^{-13}$ A and only a small current flows; however, when the gate voltage switches to negative, the current between the source and the drain increases. A threshold voltage Vth3 is −3 Volts to −1 Volts. That is, when the gate voltage is negative, the thin film transistor has is in an ON state. When the readout voltage Vr is applied as a common gate voltage to each of these three types of thin film transistors, an OFF state is obtained for the thin film transistor (a) using an oxide semiconductor that is not irradiated, an ON state is obtained for the thin film transistor (b) that is irradiated with ultraviolet light, and an ON state for the p-channel-type thin film transistor. At this time, it is acceptable as long as the readout voltage Vr is a voltage that satisfies Vth2<Vr<Vth3, Vth1. Regarding the thin film transistor with an oxide semiconductor, although there are many cases when threshold control is difficult, the thin film transistor having an even normally—on characteristic can be used for the readout from the memory device as long as the readout voltage Vr satisfies the above relationship.

Figure 13:
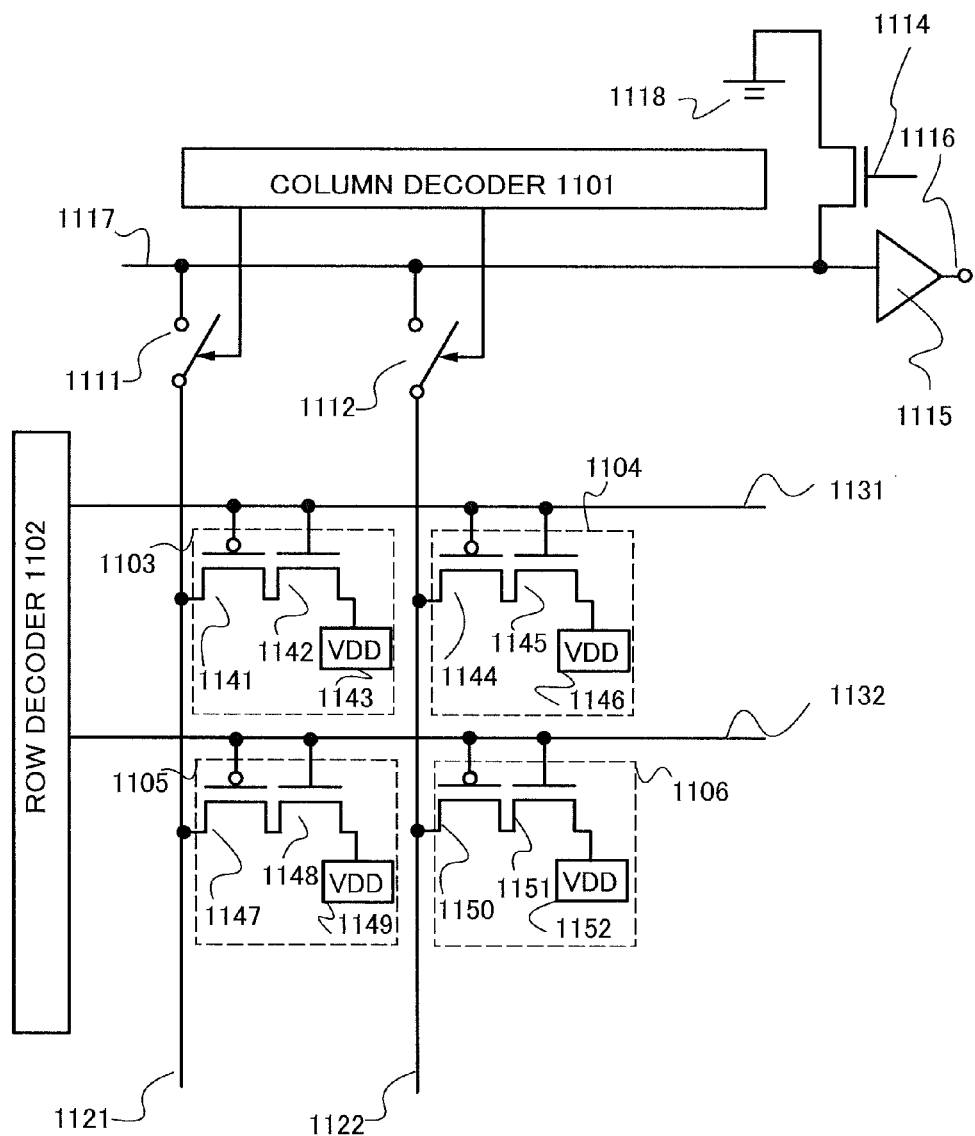
FIG. 13 illustrates data readout from a memory cell array provided with a peripheral circuit which is one embodiment of the present invention.

A method of reading data out of a memory element array in which data is written with ultraviolet light will be explained with reference to FIG. 13.

The first word line 1131 and the second word line 1132 extend from a row decoder 1102, and the first bit line 1121 and the second bit line 1122 extend from a column decoder 1101, to form a matrix with 4 bits. In the first bit, the first thin film transistor 1141 and the second thin film transistor 1142 are placed.

The first bit line 1121 and the second bit line 1122 are connected to a supply line 1117. A source portion of the thin film transistor 1114 which has a function as a resistance with a fixed resistance value is connected to a ground potential 1118, a drain portion is connected the supply line 1117 and an amplifier 1115, and the amplifier outputs a potential of that portion from an output portion 1116. Although the thin film transistor 1114 is connected to the ground potential 1118, it is not limited to the ground potential, and it is acceptable as long as a lower potential than VDD can be obtained.

A readout operation that takes into consideration an electrical characteristic of each of the thin film transistor will be explained. VDD is applied to a word line when it is not selected. The first word line 1131 is selected by the row decoder 1102 and a ground state is given to the first word line 1131, and a non-selected state is maintained in the second word line 1132 and VDD is applied. The gate electrode layer of each of the first thin film transistor (p-channel-type thin film transistor) 1141 and the second thin film transistor (the thin film transistor including an oxide semiconductor) 1142 in the first bit 1103 is in a ground state. A drain side is connected to the VDD 1143. Meanwhile, a column switch 1111 is turned on and the column decoder 1101 selects the first bit line 1121. In this case, when a potential of the VDD 1143 of a drain portion is set as a standard, a potential of the gate electrode layer and the source electrode layer are seen as −VDD. Accordingly, −VDD may be used as the readout voltage of the gate electrode layer. That is, the transistor may be operated according to the transistor characteristic at the readout voltage Vr of the gate voltage shown in FIGS. 12A to 12C. The first thin film transistor 1141 of the first bit 1103 is in an On-state, and the thin film transistor 1142 using an oxide semiconductor in which writing is performed with ultraviolet light is in an On-state. That is, an On-state is obtained at two transistors that are arranged in series, and resistance in this portion is low. At this time, most of a potential difference between the VDD and the ground potential 1118 is applied to the thin film transistor 1114. A potential on a first bit line 1121 side that is connected to the first thin film transistor 1141 is large, and is close to VDD. When an observation is made with the ground potential 1118 as a standard, "High" is output as an output wiring signal from the amplifier 1115.

The second bit 1104 will be considered. Writing is not performed on this bit. In a similar manner, the first thin film transistor 1144 and the second thin film transistor 1145 connected to the first word line 1131 and the second bit line 1122 are selected by the first word line being in a ground state. When a potential on the drain side of the second thin film transistor to which the VDD is connected is considered as a standard, the potential of the gate electrode is considered as −VDD, and the first thin film transistor 1144 is in an ON state and the second thin film transistor 1145 using an oxide semiconductor in which writing is performed with ultraviolet light is in an OFF state (see FIG. 12B). Because the source portion of the second thin film transistor and the drain portion of the first thin film transistor are connected to each other, when the first thin film transistor is in an ON state and the second thin film transistor is in an OFF state, the second bit is in an OFF state, thus a resistance value of this portion is high, and a high voltage is applied. A potential on a second bit line 1122 side becomes close to the ground potential 1118. That is, the amplifier 1115 outputs "Low." In a similar manner, when the second word line is selected, "Low" is output from the third bit 1105 in which writing is not performed, and "High" is output from the fourth bit 1106.

For the third bit 1105, VDD is applied from the row decoder 1102 to the second word line 1132 which is not selected. Here, the first thin film transistor 1147 and the second thin film transistor 1148 (writing with ultraviolet light not performed) are connected. Because VDD is applied to the drain portion and the gate electrode layer of the second thin film transistor 1148, when a potential of VDD 1149 is considered as a standard, the gate portion and the drain portion has the same potential, and a switching characteristic when 0 volts is applied to the gate electrode layer is applied. The first thin film transistor is in an OFF state (see FIG. 12C). The third bit 1105 is in an OFF state, and a resistance of this portion is high. That is, in the third bit 1105, a potential on a first bit line 1121 side is decreased and comes close to a ground side. Accordingly, "Low" is output from the amplifier 1115 as an output wiring signal. At this time, a switching state at 0 volts in the gate electrode of the second thin film transistor in which writing is not performed may be an OFF state as mentioned above. Even if a certain value of threshold shifts to a negative side and comes to an ON state, as long as the first thin film transistor is in an OFF state, there is no change in a fact that the present bit is in an OFF state and there will not be an error in reading out data that is not written.

A situation where the second word line 1132 in the fourth bit 1106 in which writing is performed is not selected will be explained. VDD is applied to the second word line, that is, the gate electrode layer of each of the thin film transistors and there is no difference in potential with the VDD 1152 on the drain side of the second thin film transistor, and if the drain side is to be a standard, a switching state of when 0 volts is applied to the gate electrode layer is obtained. That is, the first thin film transistor reaches an OFF state and the second thin film transistor reaches an ON state, and a characteristic of the two thin film transistors is an OFF state. A potential on the second bit line 1122 side is close to the ground potential 1118, and "Low" is output from the amplifier 1115 as an output wiring signal. In this manner, data "1001" that is written in the 4-bit memory cell array is output as "High, Low, Low, High." The data read out in FIG. 6 is "Low, High, High, Low," which is the opposite of the above readout result. This is because the positions of the power VDD and the ground are opposite, and there is no difference in readout results.

A truth table of this example is shown in FIG. 14. A readout method will be described. That is, from a bit in which writing is performed, "High" is detected when the word line is selected, but only "Low" is detected when the word line is not selected. From a bit in which writing is not performed, only "Low" is detected in both cases of the word line being selected and not selected. That is, detection is only done for bits in which writing is performed. The writing can be read out exactly the way it is. On the other hand of outputting an ON state, OFF state is output in the case that the word line is not selected even if writing is performed, or in the case of a bit in which writing is not performed. Also, the Id-Vg characteristic 1201 of the thin film transistor before writing is not sufficiently in an OFF state with a gate voltage at 0 volts, and threshold shifts negatively. That is, even if it is in an OFF state with the gate voltage at 0 volts, an OFF state can be maintained as an output because the first thin film transistor is in an OFF state. That is, even if there is a threshold shift in the Id-Vg characteristic of the oxide semiconductor, the truth table in FIG. 14 can be maintained without change. In the memory cell array, although the p-channel-type thin film transistor is provided in addition to the thin film transistor with an oxide semiconductor and makes an element density twice as much, even if there is variance in characteristics of thin film transistors used for such writings, the memory cell array operates properly according to the truth table with respect to whether or not writing is performed.

Also, in FIG. 14, the truth-value is formed depending on an ON-state and OFF-state combination of the first thin film transistor and the second thin film transistor. That is, a permutation position relationship of the first thin film transistor and the second thin film transistor does not matter. In FIG. 11, although the first thin film transistor 1114 is connected to the bit line 1121, and the second thin film transistor 1142 is connected to the drain electrode layer of the first thin film transistor 1141, the connections may be of reverse permutation. The source electrode layer of the second thin film transistor which contains an oxide semiconductor layer may be connected to the bit line, or the drain electrode layer thereof may be connected to the source electrode layer of the first thin film transistor. With this, the drain electrode layer of the first thin film transistor becomes connected to VDD. Even with such an arrangement, the truth-value of FIG. 14 is applied without change.

(Embodiment 3)

Figure 15:
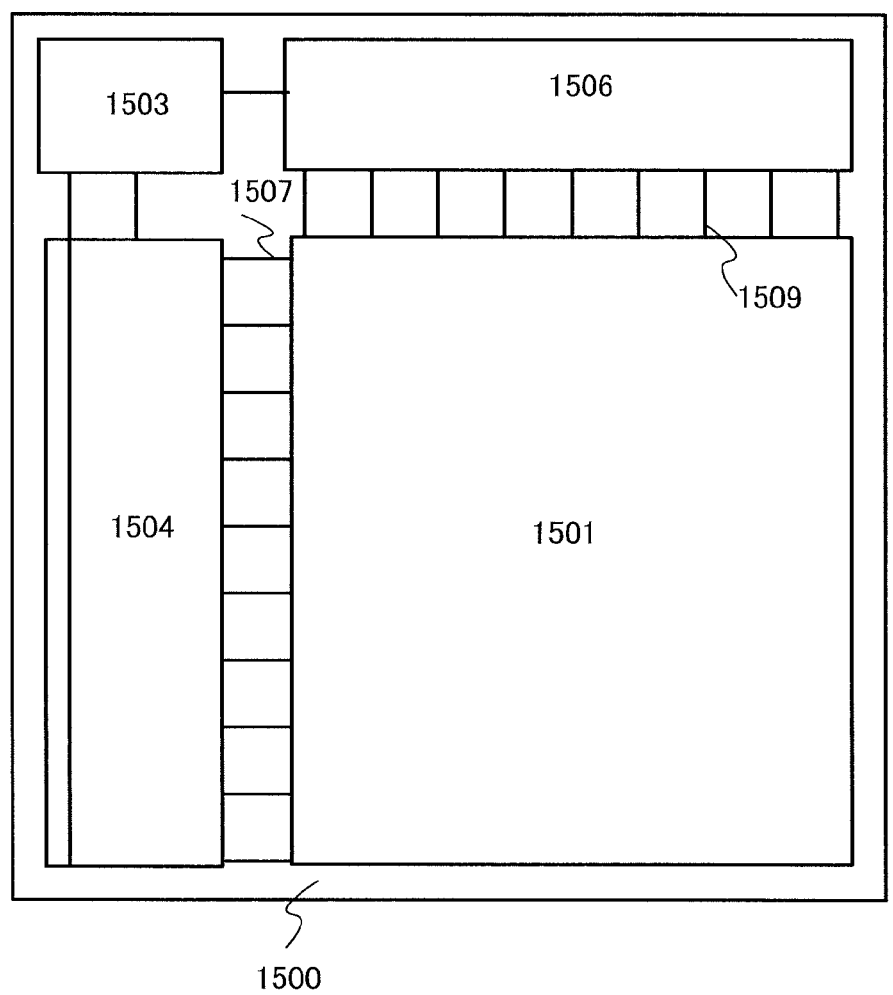
FIG. 15 illustrates a memory module to which a memory cell array is applied.

This embodiment describes a memory module 1500 to which one of the embodiments 1 and 2 is applied (see FIG. 15). The memory module 1500 includes a first memory cell region 1501, an interface 1503, a row decoder 1504, and a column decoder 1506.

In the first memory cell region 1501, a plurality of memory cell arrays described in the above embodiments is provided. In a second memory cell region 1502, a plurality of memory cell arrays described in the above embodiments is provided (see FIG. 15).

The row decoder 1504 corresponds to the row decoder 602 shown in Embodiment 1, for example, and is connected to the first memory cell region 1501 by a word line 1507.

The column decoder 1506 corresponds to the column decoder 601 shown in Embodiment 1, for example, and has a readout circuit and is connected to the first memory cell region 1501 and the second memory cell region 1502 by a bit line 1509.

Each of the row decoder 1504, the row decoder 1505, and the column decoder 1506 is connected to the interface 1503.

In the present invention, a threshold voltage of a transistor is changed by irradiating the transistor with ultraviolet light. Therefore, it is preferable that the region is generally covered with a shield which blocks ultraviolet light. The shield is removed by a person admitted to the region, and then the transistor is irradiated with ultraviolet light. Since region is covered by the shield, the region cannot be accessed by a third party.

(Embodiment 4)

Figure 16:
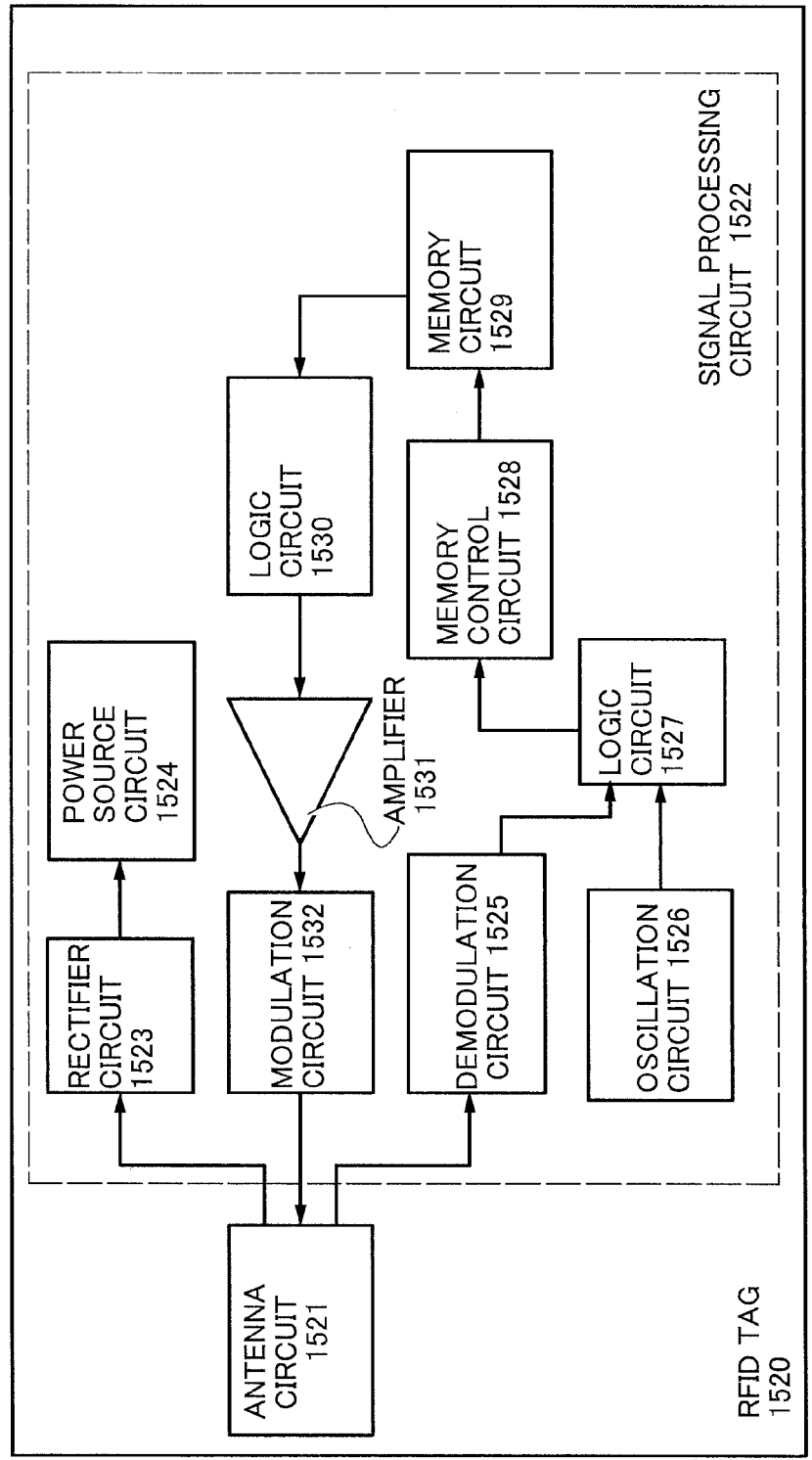
FIG. 16 illustrates an RFID tag.

In this embodiment, an RFID tag 1520 (see FIG. 16) including the memory module described in the above embodiment is described.

The RFID tag 1520 includes an antenna circuit 1521 and a signal processing circuit 1522. The signal processing circuit 1522 includes a rectifier circuit 1523, a power circuit 1524, a demodulation circuit 1525, an oscillation circuit 1526, a logic circuit 1527, a memory control circuit 1528, a memory circuit 1529, a logic circuit 1530, an amplifier 1531, and a modulation circuit 1532. The memory circuit 1529 includes the memory module of the above embodiment.

A communication signal received by the antenna circuit 1521 is input to the demodulation circuit 1525. The frequency of the received communication signal, that is, the frequency of a signal communicated between an antenna circuit 1521 and a reader/writer, is for example 13.56 MHz, 915 MHz, 2.45 GHz, or the like in an ultra high frequency band, which is determined on the basis of the ISO standard or the like. Needless to say, the frequency of the signal communicated between the antenna circuit 1521 and the reader/writer is not limited thereto, and for example, any of the following frequencies can be used: a submillimeter wave of 300 GHz to 3 THz; a millimeter wave of 30 GHz to 300 GHz; a microwave of 3 GHz to 30 GHz; an ultra high frequency of 300 MHz to 3 GHz; and a very high frequency of 30 MHz to 300 MHz. Furthermore, the signal communicated between the antenna circuit 1521 and the reader/writer is a signals obtained through carrier wave modulation. A carrier wave is modulated by analog modulation or digital modulation, and any of amplitude modulation, phase modulation, frequency modulation, and spread spectrum may be used. Preferably, amplitude modulation or frequency modulation is used.

An oscillation signal output from the oscillation circuit 1526 is supplied as a clock signal to the logic circuit 1527. In addition, a modulated carrier wave is demodulated in the demodulation circuit 1525. The signal after demodulation is also transmitted to the logic circuit 1527 to be analyzed. The signal analyzed in the logic circuit 1527 is transmitted to the memory control circuit 1528. The memory control circuit 1528 controls the memory circuit 1529, takes out data stored in the memory circuit 1529, and transmits the data to the logic circuit 1530. The signal transmitted to the logic circuit 1530 is encoded in the logic circuit 1530 and amplified in the amplifier 1531, and with this signal, the modulation circuit 1532 modulates a carrier wave. With this modulated carrier wave, the reader/writer recognizes the signal from the RFID tag 1520.

The carrier wave that is input to the rectifier circuit 1523 is rectified, and then input to the power circuit 1524. A power source voltage obtained in this manner is supplied by the power circuit 1524 to the demodulation circuit 1525, the oscillation circuit 1526, the logic circuit 1527, the memory control circuit 1528, the memory circuit 1529, the logic circuit 1530, the amplifier 1531, the modulation circuit 1532, and the like.

A connection between the signal processing circuit 1522 and an antenna in the antenna circuit 1521 is not particularly limited. For example, the antenna and the signal processing circuit 1522 are connected by wire bonding, bump connection, or by forming the signal processing circuit 1522 into a chip and attaching one surface thereof which serves as an electrode to the antenna. The signal processing circuit 1522 and the antenna can be attached using an ACF (anisotropic conductive film).

The antenna is either laminated over the same substrate as the signal processing circuit 1522, or formed as an external antenna. Needless to say, the antenna is provided on an upper portion of lower portion of the signal processing circuit. The rectifier circuit 503 converts an AC signal that is induced by a carrier wave received by the antenna circuit 1521 into a DC signal.

Figure 17:
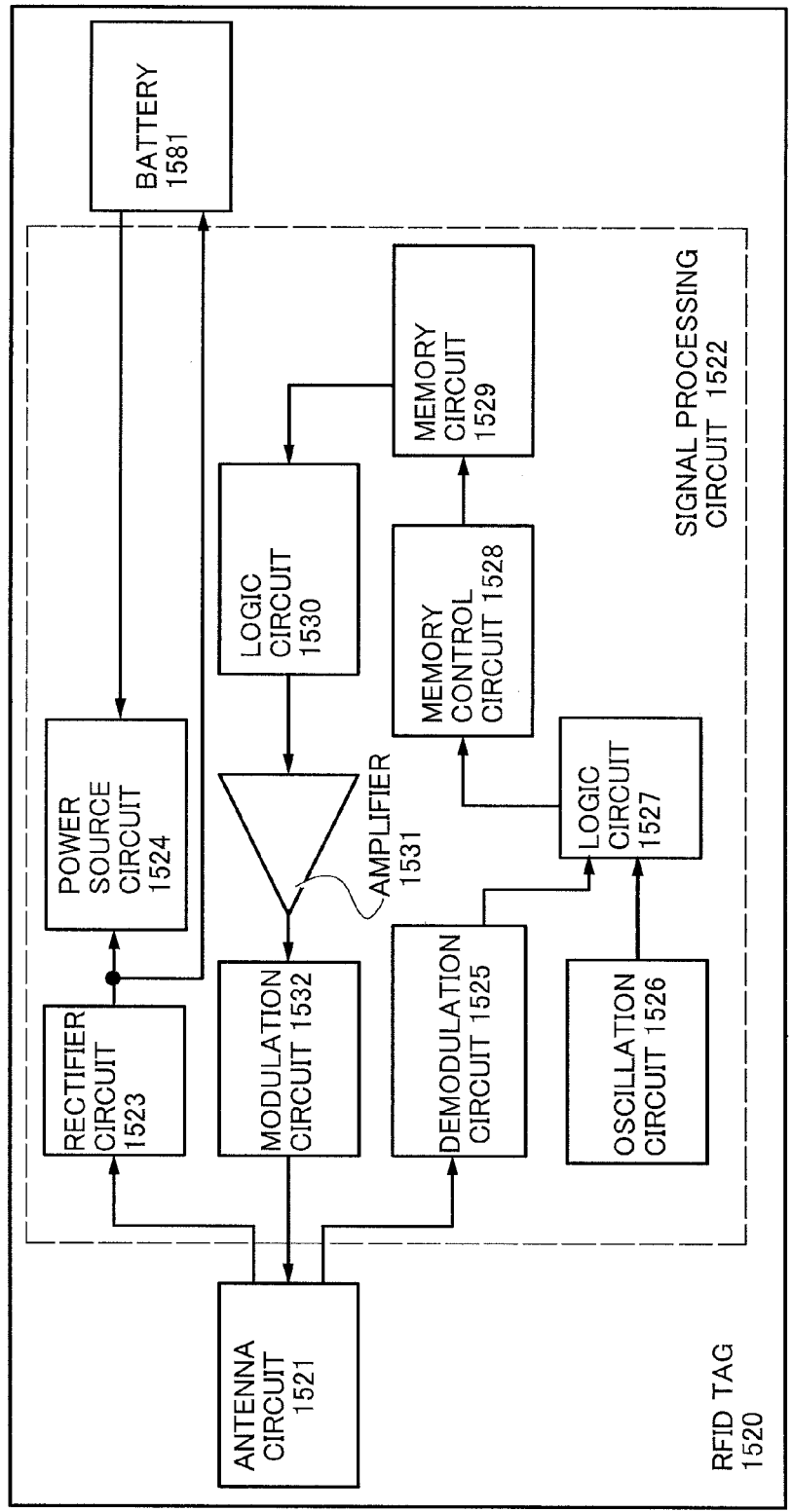
FIG. 17 illustrates an RFID tag.

The RFID tag 1520 may include a battery 1581 (FIG. 17). When power source voltage output from the rectifier circuit 1523 is not sufficient for operating the signal processing circuit 1522, the battery 1581 also supplies a power source voltage to various circuits included in the signal processing circuit 1522, such as, for example, the demodulation circuit 1525, the oscillation circuit 1526, the logic circuit 1527, the memory control circuit 1528, the memory circuit 1529, the logic circuit 1530, the amplifier 1531, and the modulation circuit 1532.

Surplus voltage of the power source voltage output from the rectifier circuit 1523 may be stored in the battery 1581. When an antenna circuit and a rectifier circuit are provided in the RFID tag in addition to the antenna circuit 1521 and the rectifier circuit 1523, energy stored in the battery 1581 can be obtained from an electromagnetic wave and the like that are generated randomly.

The battery can be used continuously by charging. As the battery, a battery formed into a sheet form is used. For example, by using a lithium polymer battering that includes a gel electrolyte, a lithium ion battery, a lithium secondary battery, or the like, size of the battery can be reduced. For example, a nickel-metal-hydride battery, a nickel-cadmium battery, or the like can be given. Alternatively, a capacitor with large capacitance or the like can be used.

(Embodiment 5)

In this embodiment, application examples of the RFID tag 1520 shown in the above embodiment will be described (FIGS. 18A to 18F).

Figure 18A:
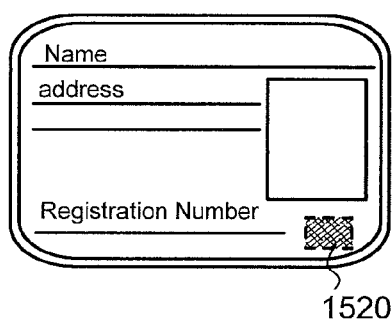
FIGS. 18A to 18F illustrate usage examples of an RFID tag.
Figure 18B:
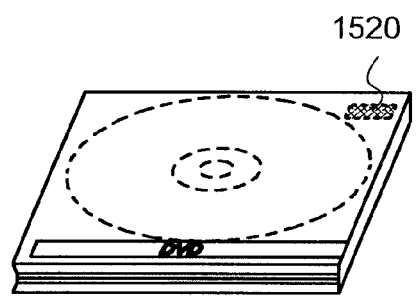
Figure 18C:
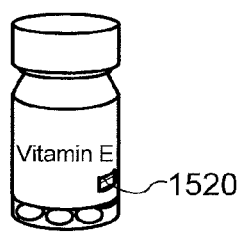
Figure 18D:
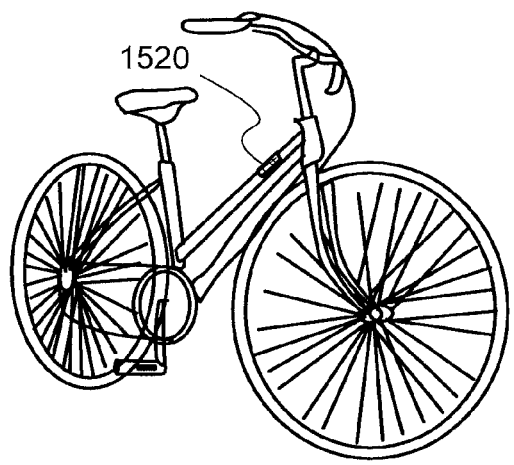
Figure 18E:
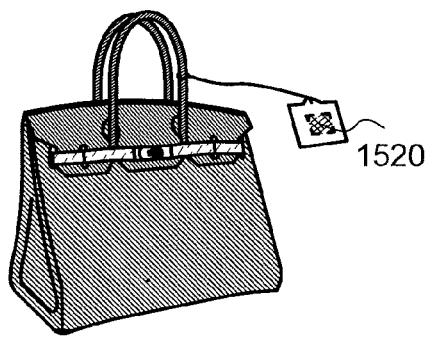
Figure 18F:
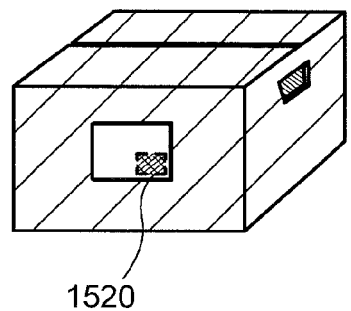

The RFID tag 1520 is widely used and can be provided for, for example, products such as bills, coins, securities, bearer bonds, documents (such as a driver's license or a resident's card, see FIG. 18A), packaging containers (such as wrapping paper or a bottle, see FIG. 18C), recording media (such as a DVD software or a videotape, see FIG. 18B), vehicles (such as a bicycle, see FIG. 18D), personal belongings (such as shoes and glasses), foods, plants, animals, human bodies, clothing, household goods, and electronic appliances (such as a liquid crystal display device, an EL display device, a television device, or a cellular phone); or tags on products (see FIGS. 18E and 18F).

The RFID tag 1520 is fixed to a product by being mounted on a printed substrate, attached to a surface of the product, or embedded in the product. For example the RFID tag 1520 is embedded in a book, or embedded in an organic resin for a package made of the organic resin. Since the RFID tag 1520 can be reduced in size, thickness, and weight, it can be fixed to a product without spoiling the design of the product. Furthermore, bills, coins, securities, bearer bonds, document, or the like can have an identification function by being provided with the RFID tag 1520, and this identification function can be used to prevent counterfeiting. Also, by attaching the semiconductor device of the present invention to packaging containers, recording media, personal belongings, foods, clothing, household goods, electronic appliances, or the like, a system such as an inspection system can be efficiently used. Also, by attaching the RFID tag 1520 to vehicles, security against theft or the like can be improved.

EXAMPLE

Figure 19A:
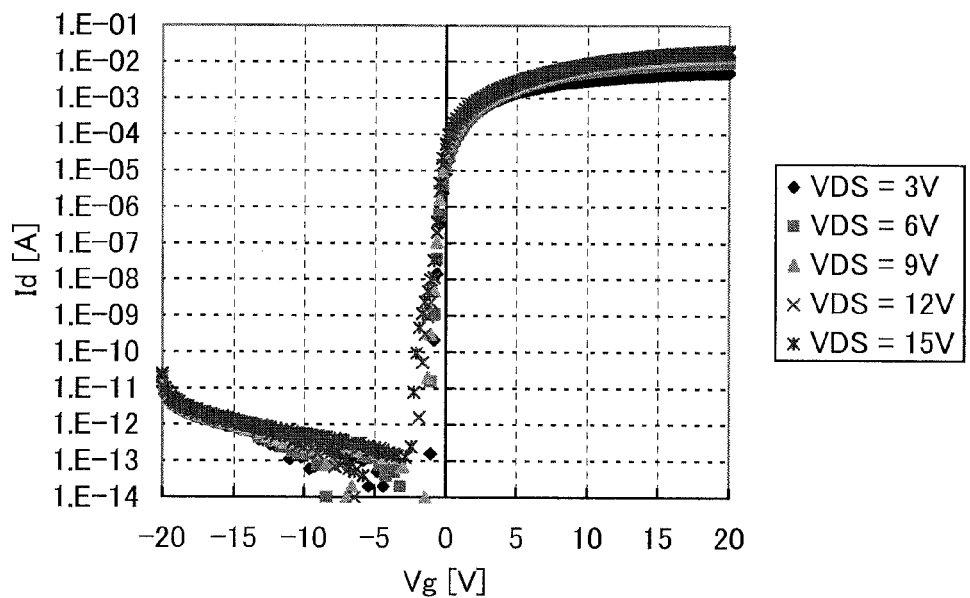
FIGS. 19A and 19B illustrate change in threshold.
Figure 19B:
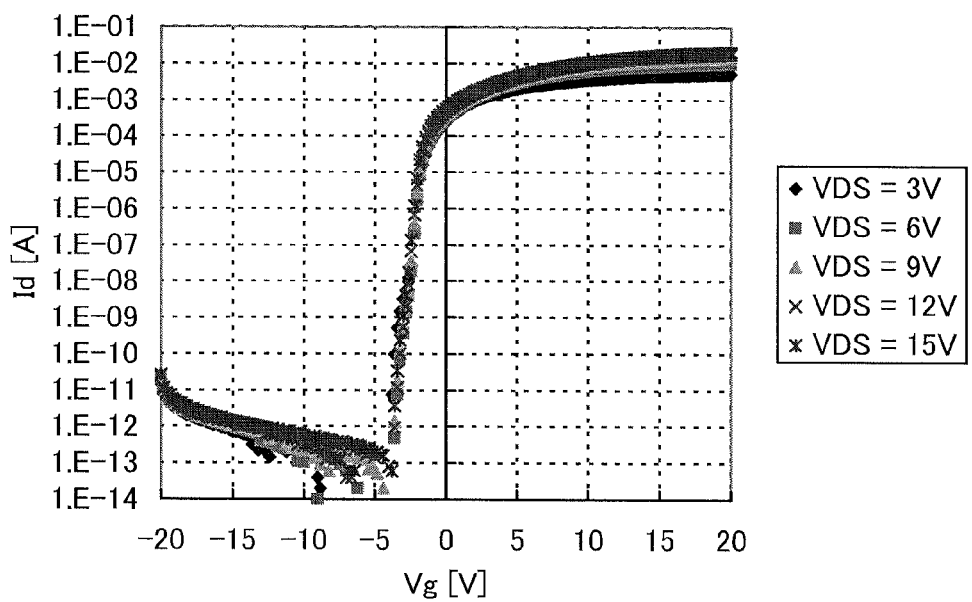

FIGS. 19A and 19B each show an example of a measurement of an Id-Vg characteristic of a thin film transistor in which a channel portion is formed using an oxide semiconductor layer. FIG. 19A shows the Id-Vg characteristic of the thin film transistor before ultraviolet light irradiation. FIG. 19B shows the Id-Vg characteristic of the thin film transistor after ultraviolet light irradiation. VDS in the figures shows a voltage between a source and drain. A wavelength of the ultraviolet light is 254 nm, an ultraviolet light intensity is 0.06 mW/cm$^2$, and irradiation time is 3 minutes. An In—Ga—Zn—O-based oxide semiconductor is used or the channel. A structure of the TFT is a bottom-gate type of the thin film transistor including an oxide semiconductor shown in FIG. 9. The ultraviolet light is emitted to the channel from above the channel.

When the TFT is irradiated with ultraviolet light, a threshold voltage of −0.54 Volts and an S value of 0.064 before irradiation change to a threshold voltage of −2.16 Volts and an S value of 0.18 after ultraviolet light irradiation. By using this phenomenon, the channel drives the transistor including an oxide semiconductor.

This application is based on Japanese Patent Application serial no. 2009-276751 filed with Japan Patent Office on Dec. 4, 2009, the entire contents of which are hereby incorporated by reference.

What is claimed is:

1. A semiconductor device comprising:
   a sensing transistor comprising:
      a gate electrode;
      an oxide semiconductor layer including a channel forming region, the channel forming region overlapping with the gate electrode with an insulating film therebetween;
      a source electrode electrically connected to the oxide semiconductor layer; and
      a drain electrode electrically connected to the oxide semiconductor layer;
   a first potential source electrically connected to the gate electrode through a first wiring;
   a second potential source electrically connected to the source electrode through a second wiring, and
   a third potential source electrically connected to the source electrode through a third wiring,
   wherein a light exposed state of the sensing transistor is detected when a first current of the channel forming region is larger than a second current of the channel forming region at a dark state of the sensing transistor.

2. The semiconductor device according to claim 1, wherein a first voltage of the first potential source supplying to the gate electrode is larger than a first threshold voltage of the sensing transistor at the light exposed state of the sensing transistor, and smaller than a second threshold voltage of the sensing transistor at the dark state of the sensing transistor, when the light exposed state of the sensing transistor is detected.

3. The semiconductor device according to claim 1, wherein the second potential source or the third potential source has a ground state.

4. A semiconductor device comprising:
   a sensing transistor comprising:
      a gate electrode;
      an oxide semiconductor layer including a channel forming region, the channel forming region overlapping with the gate electrode with an insulating film therebetween;
      a source electrode electrically connected to the oxide semiconductor layer; and
      a drain electrode electrically connected to the oxide semiconductor layer;
   a first potential source electrically connected to the gate electrode through a first wiring;
   a second potential source electrically connected to the source electrode through a second wiring, and
   a third potential source electrically connected to the source electrode through a third wiring,
   wherein a dark state of the sensing transistor is detected when a first current of the channel forming region is smaller than a second current of the channel forming region at a light exposed state of the sensing transistor.

5. The semiconductor device according to claim 4, wherein a first voltage of the first potential source supplying to the gate electrode is larger than a first threshold voltage of the sensing transistor at the light exposed state of the sensing transistor, and smaller than a second threshold voltage of the sensing transistor at the dark state of the sensing transistor, when the light exposed state of the sensing transistor is detected.

6. The semiconductor device according to claim 4, wherein the second potential source or the third potential source has a ground state.

7. A semiconductor device comprising:
  a sensing transistor comprising:
    a gate electrode;
    an oxide semiconductor layer including a channel forming region, the channel forming region overlapping with the gate electrode with an insulating film therebetween;
    a source electrode electrically connected to the oxide semiconductor layer; and
    a drain electrode electrically connected to the oxide semiconductor layer;
  a switching transistor comprising:
    a gate electrode;
    an semiconductor layer including a channel forming region, the channel forming region overlapping with the gate electrode of the switching transistor with an insulating film therebetween;
    a source electrode electrically connected to the semiconductor layer; and
    a drain electrode electrically connected to the semiconductor layer and the source electrode of the sensing transistor;
  a first potential source electrically connected to the gate electrode of the sensing transistor and the gate electrode of the switching transistor through a first wiring;
  a second potential source electrically connected to the source electrode of the switching transistor through a second wiring, and
  a third potential source electrically connected to the drain electrode of the sensing transistor,
  wherein a light exposed state of the sensing transistor is detected when a first current of the channel forming region of the sensing transistor is larger than a second current of the channel forming region at a dark state of the sensing transistor.

8. The semiconductor device according to claim 7, wherein a first voltage of the first potential source supplying to the gate electrode of the sensing transistor and the gate electrode of the switching transistor is larger than a first threshold voltage of the sensing transistor at the light exposed state of the sensing transistor, and smaller than a second threshold voltage of the sensing transistor at the dark state of the sensing transistor and a third threshold voltage of the switching transistor, when the light exposed state of the sensing transistor is detected.

9. The semiconductor device according to claim 7, wherein the second potential source or the third potential source has a ground state.

10. A semiconductor device comprising:
  a sensing transistor comprising:
    a gate electrode;
    an oxide semiconductor layer including a channel forming region, the channel forming region overlapping with the gate electrode with an insulating film therebetween;
    a source electrode electrically connected to the oxide semiconductor layer; and
    a drain electrode electrically connected to the oxide semiconductor layer;
  a switching transistor comprising:
    a gate electrode;
    an semiconductor layer including a channel forming region, the channel forming region overlapping with the gate electrode of the switching transistor with an insulating film therebetween;
    a source electrode electrically connected to the semiconductor layer; and
    a drain electrode electrically connected to the semiconductor layer and the source electrode of the sensing transistor;
  a first potential source electrically connected to the gate electrode of the sensing transistor and the gate electrode of the switching transistor through a first wiring;
  a second potential source electrically connected to the source electrode of the switching transistor through a second wiring, and
  a third potential source electrically connected to the drain electrode of the sensing transistor,
  wherein a dark state of the sensing transistor is detected when a third current of the channel forming region is smaller than a fourth current of the channel forming region at a light exposed state of the sensing transistor.

11. The semiconductor device according to claim 10, wherein a first voltage of the first potential source supplying to the gate electrode of the sensing transistor and the gate electrode of the switching transistor is larger than a first threshold voltage of the sensing transistor at the light exposed state of the sensing transistor, and smaller than a second threshold voltage of the sensing transistor at the dark state of the sensing transistor and a third threshold voltage of the switching transistor, when the light exposed state of the sensing transistor is detected.

12. The semiconductor device according to claim 10, wherein the second potential source or the third potential source has a ground state.

13. A semiconductor device comprising:
  a sensing transistor comprising:
    a gate electrode;
    an oxide semiconductor layer including a channel forming region, the channel forming region overlapping with the gate electrode with an insulating film therebetween;
    a source electrode electrically connected to the oxide semiconductor layer; and
    a drain electrode electrically connected to the oxide semiconductor layer;
  a row decoder electrically connected to the gate electrode through a first wiring;
  a column decoder electrically connected to the source electrode through a second wiring; and
  a readout circuit electrically connected to the second wiring,
  a first potential source electrically connected to the drain electrode through a third wiring
  wherein a light exposed state of the sensing transistor is detected when a first current of the channel forming region is larger than a second current of the channel forming region at a dark state of the sensing transistor, and
  wherein a first voltage of the first potential source supplying to the gate electrode is larger than a first threshold voltage of the sensing transistor at the light exposed state of the sensing transistor, and smaller than a second threshold voltage of the sensing transistor at the dark state of the sensing transistor.

14. The semiconductor device according to claim 13, wherein the gate electrode comprises a transparent electrode.

15. The semiconductor device according to claim 13, wherein the first potential source has a ground state.

16. The semiconductor device according to claim 13,
wherein the readout circuit comprises a second potential source, an amplifier, and a reference transistor,
wherein the amplifier is electrically connected to the second potential source through the reference transistor and the second wiring.

17. A semiconductor device comprising:
a sensing transistor comprising:
 a gate electrode;
 an oxide semiconductor layer including a channel forming region, the channel forming region overlapping with the gate electrode with an insulating film therebetween;
 a source electrode electrically connected to the oxide semiconductor layer; and
 a drain electrode electrically connected to the oxide semiconductor layer;
a switching transistor comprising:
 a gate electrode;
 an semiconductor layer including a channel forming region, the channel forming region overlapping with the gate electrode of the switching transistor with an insulating film therebetween;
 a source electrode electrically connected to the semiconductor layer; and
 a drain electrode electrically connected to the semiconductor layer and the source electrode of the sensing transistor;
a row decoder electrically connected to the gate electrode of the sensing transistor and the gate electrode of the switching transistor through a first wiring;
a column decoder electrically connected to the source electrode of the switching transistor through a second wiring; and
a readout circuit electrically connected to the second wiring,
a first potential source electrically connected to the drain electrode of the sensing transistor through a third wiring.

18. The semiconductor device according to claim 17, wherein the gate electrode comprises a transparent electrode.

19. The semiconductor device according to claim 17, wherein the first potential source has a ground state.

20. The semiconductor device according to claim 17,
wherein the readout circuit comprises a second potential source, an amplifier, and a reference transistor,
wherein the amplifier is electrically connected to the second potential source through the reference transistor and the second wiring.

21. The semiconductor device according to claim 17,
wherein a light exposed state of the sensing transistor is detected when a first current of the channel forming region is larger than a second current of the channel forming region at a dark state of the sensing transistor, and
wherein a first voltage of the first potential source supplying to the gate electrode is larger than a first threshold voltage of the sensing transistor at the light exposed state of the sensing transistor, and smaller than a second threshold voltage of the sensing transistor at the dark state of the sensing transistor and a third threshold voltage of the switching transistor.

* * * * *